United States Patent
Kim et al.

(10) Patent No.: US 9,263,536 B2
(45) Date of Patent: Feb. 16, 2016

(54) METHODS OF FABRICATING SEMICONDUCTOR DEVICES WITH ELECTRODE SUPPORT PATTERNS

(71) Applicant: Samsung Electronics Co., Ltd., Suwon-si (KR)

(72) Inventors: Hong-Gun Kim, Hwaseong-si (KR); Young-Min Ko, Hwaseong-si (KR); Kwang-Tae Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/062,138

(22) Filed: Oct. 24, 2013

(65) Prior Publication Data

US 2014/0134839 A1    May 15, 2014

(30) Foreign Application Priority Data

Nov. 13, 2012  (KR) .......................... 10-2012-0128228

(51) Int. Cl.
| | |
|---|---|
| *H01L 27/108* | (2006.01) |
| *H01L 29/76* | (2006.01) |
| *H01L 29/94* | (2006.01) |
| *H01L 31/119* | (2006.01) |
| *H01L 29/423* | (2006.01) |
| *H01L 49/02* | (2006.01) |
| *H01L 21/28* | (2006.01) |

(52) U.S. Cl.
CPC ...... *H01L 29/4236* (2013.01); *H01L 27/10814* (2013.01); *H01L 27/10852* (2013.01); *H01L 28/92* (2013.01); *H01L 21/28008* (2013.01); *H01L 27/10823* (2013.01)

(58) Field of Classification Search
CPC ............ H01L 27/0733; H01L 27/0805; H01L 27/108; H01L 27/3265; H01L 28/40; H01L 28/60; H01L 29/92
USPC .................. 257/296, 300, 303, 304, 306, 532
See application file for complete search history.

(56) References Cited

U.S. PATENT DOCUMENTS

| | | |
|---|---|---|
| 7,994,561 B2 | 8/2011 | Kim et al. |
| 2009/0243037 A1 | 10/2009 | Park |
| 2010/0117196 A1 | 5/2010 | Manning |
| 2010/0240179 A1 | 9/2010 | Kim et al. |
| 2010/0240191 A1* | 9/2010 | Chung et al. .................. 438/386 |
| 2011/0042733 A1 | 2/2011 | Komeda et al. |
| 2011/0062552 A1 | 3/2011 | Tsuchiya |
| 2012/0015494 A1 | 1/2012 | Kobayashi et al. |
| 2013/0147048 A1* | 6/2013 | Kuh et al. ..................... 257/768 |

FOREIGN PATENT DOCUMENTS

| | | |
|---|---|---|
| KR | 100568733 B1 | 4/2006 |
| KR | 101041938 B1 | 6/2011 |
| KR | 20110078064 A | 7/2011 |

* cited by examiner

*Primary Examiner* — Thanhha Pham
(74) *Attorney, Agent, or Firm* — Myers Bigel Sibley & Sajovec, P.A.

(57) ABSTRACT

Methods include sequentially forming a first mold film, a first support film, a second mold film, and a second support film on a substrate, forming a contact hole through the second support film, the second mold film, the first support film and the first mold film, forming an electrode in the contact hole, and removing portions of the second support film, the second mold film and the first mold film to leave a portion of the first support film as a first support pattern surrounding the electrode and to leave a portion of the second support film as a second support pattern surrounding the electrode.

18 Claims, 24 Drawing Sheets

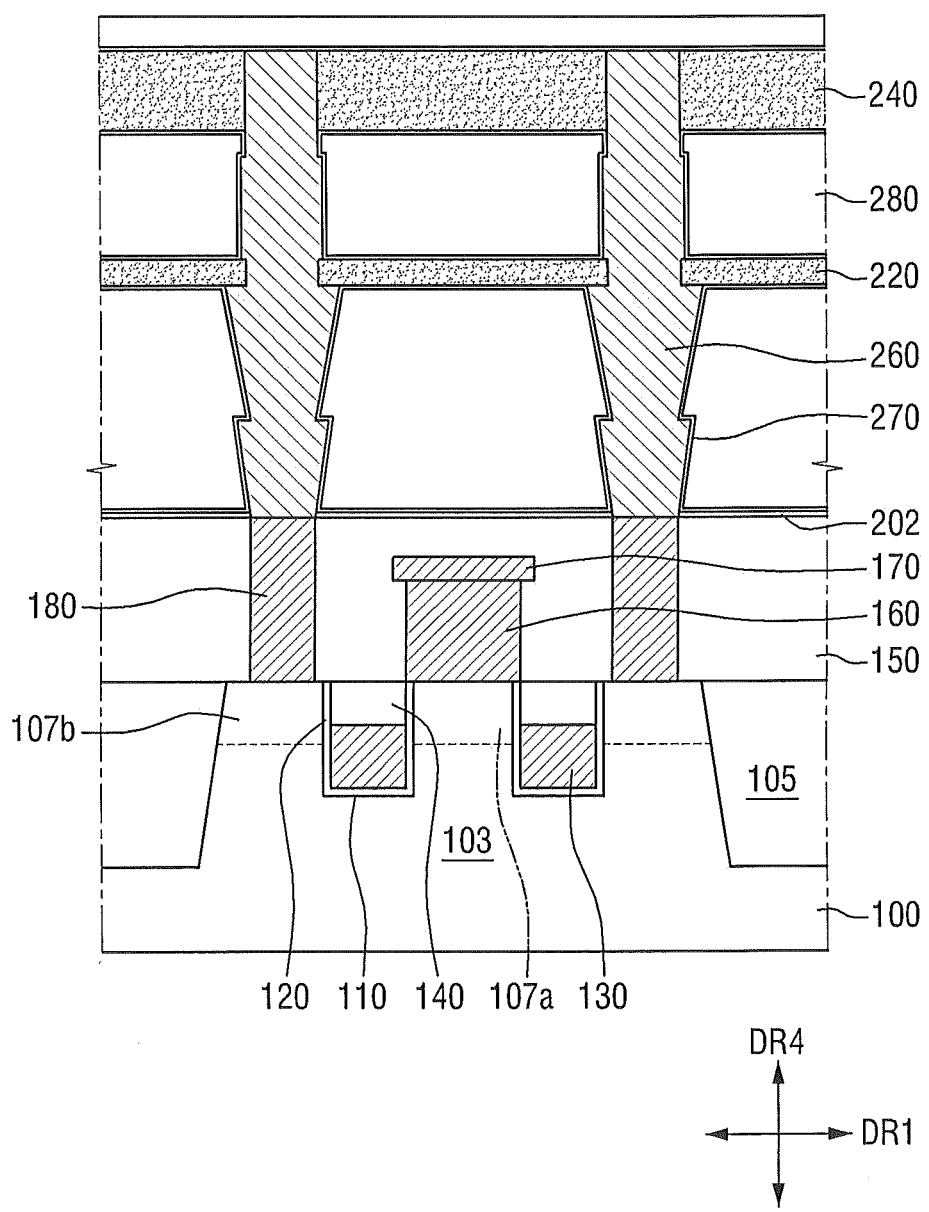

METHODS OF FABRICATING SEMICONDUCTOR DEVICES WITH ELECTRODE SUPPORT PATTERNS

This application claims priority from Korean Patent Application No. 10-2012-0128228 filed on Nov. 13, 2012 in the Korean Intellectual Property Office, the disclosure of which is incorporated herein by reference in its entirety.

BACKGROUND

1. Field of the Invention

The inventive subject matter relates to semiconductor devices and methods of fabricating the same and, more particularly, to electrode structures and methods of fabricating the same.

2. Description of the Related Art

As the capacitance and integration density of semiconductor devices increase, the design rule is continuously being reduced. This trend is also noticeable in dynamic random access memories (DRAMs) which are a type of memory semiconductor devices. More than a certain level of capacitance per cell is required for a DRAM to operate. Accordingly, research is being conducted to utilize a dielectric film having a high dielectric constant in a capacitor or increase a contact area between a bottom electrode and a dielectric film of a capacitor.

SUMMARY

Some embodiments of the inventive subject matter provide methods including sequentially forming a first mold film, a first support film, a second mold film, and a second support film on a substrate, forming a contact hole through the second support film, the second mold film, the first support film and the first mold film, forming an electrode in the contact hole, and removing portions of the second support film, the second mold film and the first mold film to leave a portion of the first support film as a first support pattern surrounding the electrode and to leave a portion of the second support film as a second support pattern surrounding the electrode. In some embodiments, the second support film may include an upper second support film and a lower second support film, and removing portions of the second support film, the second mold film and the first mold file to leave a portion of the first support film as a first support pattern surrounding the electrode and to leave a portion of the second support film as a second support pattern surrounding the electrode may include removing a portion of the lower second support film. A thickness of the lower second support film may be about 0.1 to about 0.9 times a thickness of the second support film.

In some embodiments, removing portions of the second support film, the second mold film and the first mold file to leave a portion of the first support film as a first support pattern surrounding the electrode and to leave a portion of the second support film as a second support pattern surrounding the electrode may include forming a trench exposing the lower second support film and removing the portion of the lower second support film and the portion of the second mold film using the trench as an etchant passage. In further embodiments, removing portions of the second support film, the second mold film and the first mold file to leave a portion of the first support film as a first support pattern surrounding the electrode and to leave a portion of the second support film as a second support pattern surrounding the electrode further may include forming a second trench exposing the first mold film and removing the portion of the first mold film using the second trench as an etchant passage.

According to some embodiments, forming of the contact hole may include forming a node mask on the insulating layer and etching the second support film, the second mold film, the first support film and the first mold film using the node mask as a mask. Forming an electrode in the contact hole may include forming an electrode film conforming to an inner wall of the contact hole and a top surface of the node mask, forming a sacrificial film on the electrode film in the contact hole, and removing portions of the electrode film and the node mask to expose the second support film. In some embodiments, forming an electrode in the contact hole may include forming an electrode film that fills the contact hole and removing portions of the bottom electrode film and the node mask to expose the second support film.

In still further embodiments, forming a first mold film on a substrate may include forming a lower first mold film on the substrate and forming an upper first mold film having different etch rate than the lower first mold film on the lower first mold film. A forming a dielectric film may be formed on the electrode and the first and second support pattern and another electrode may be formed on the dielectric film.

In some embodiments of the inventive subject matter, methods include sequentially forming a first mold film, a first support film, a second mold film, a lower second support film and an upper second support film on a substrate, forming a contact hole in the first mold film, the first support film, the second mold film, the lower second support film and the upper second support film, forming an electrode film in the contact hole, removing portions of the lower second support film and the second mold film to leave a portion of the upper second support film as a support pattern surrounding the electrode film, and forming an electrode in the contact hole by removing a portion of the electrode film to expose the support pattern.

Further embodiments of the inventive subject matter provide methods including sequentially forming a mold film and a support film on a conductive region in a substrate, removing portions of the support film and the mold film to form a contact hole passing through the support film and the mold film and exposing the conductive region, forming an electrode in the contact hole and in electrical contact with the conductive region, forming a trench through the support film and exposing portions of the support film and the mold film, and etching the exposed portions of the support film to remove at least a portion of the mold film and leave a portion of the support film as a support pattern surrounding the electrode.

BRIEF DESCRIPTION OF THE DRAWINGS

The above and other aspects and features of the inventive subject matter will become more apparent by describing in detail exemplary embodiments thereof with reference to the attached drawings, in which:

FIG. 3 is a view of a semiconductor device according to further embodiments of the inventive subject matter;

DETAILED DESCRIPTION

Figure 1:
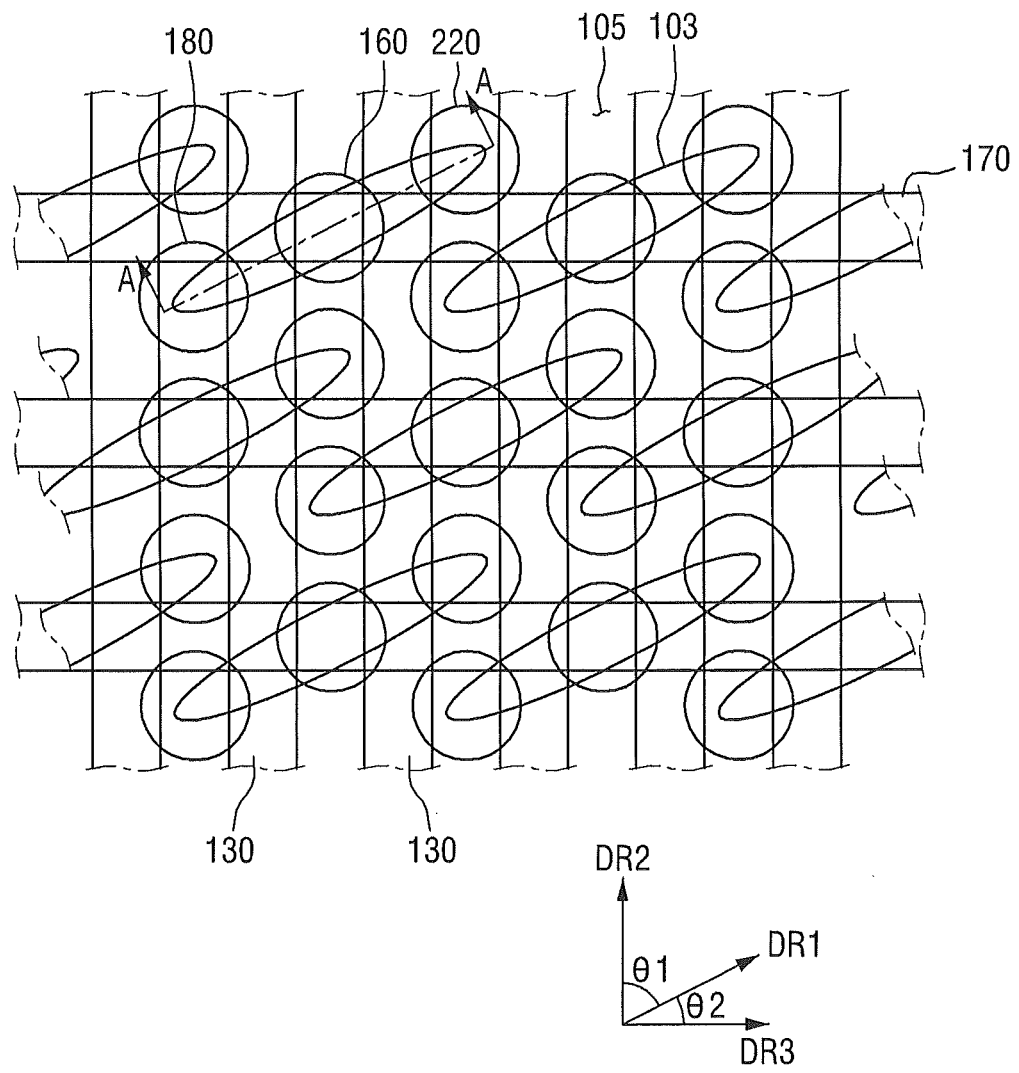
FIG. 1 is a layout view of a semiconductor device according to some embodiments of the inventive subject matter.

The inventive subject matter will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive subject matter.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The layout of a semiconductor device according to some embodiments of the inventive subject matter will now be described with reference to FIG. 1.

FIG. 1 is a layout view of a semiconductor device according to some embodiments of the inventive subject matter. FIG. 1 shows the layout of the semiconductor device before capacitors are formed.

Referring to FIG. 1, in a semiconductor device according to some embodiments of the inventive subject matter, unit active regions 103 are defined by forming device isolation regions 105 in a substrate 100. Specifically, the unit active regions 103 extend in a first direction DR1, and gate electrodes (i.e., word lines) 130 extend in a second direction DR2 which forms an acute angle with the first direction DR1, and bit lines 170 extend in a third direction DR3 which forms an acute angle with the first direction DR1.

When "a direction forms an angle with another direction," the angle is a smaller one of two angles formed by the intersection of the two directions. For example, when the two angles formed by the intersection of the two directions are 120 and 60 degrees, the angle is 60 degrees. Therefore, referring to FIG. 1, an angle formed by the first direction DR1 and the second direction DR2 is $\theta 1$, and an angle formed by the first direction DR1 and the third direction DR3 is $\theta 2$.

$\theta 1$ and/or $\theta 2$ is formed as an acute angle in order to secure a desired (e.g., maximum) gap between bit line contacts which connect the unit active regions 103 and the bit lines 170 and storage node contacts 180 (second contact plugs in FIG. 2) which connect the unit active regions 103 and capacitors (not shown). For example, $\theta 1$ and $\theta 2$ may be, but are not limited to, 45 and 45 degrees, respectively, 30 and 60 degrees, respectively, or 60 and 30 degrees, respectively.

A semiconductor device according to some embodiments of the inventive subject matter will now be described with reference to FIGS. 2A and 2B.

Figure 2A:
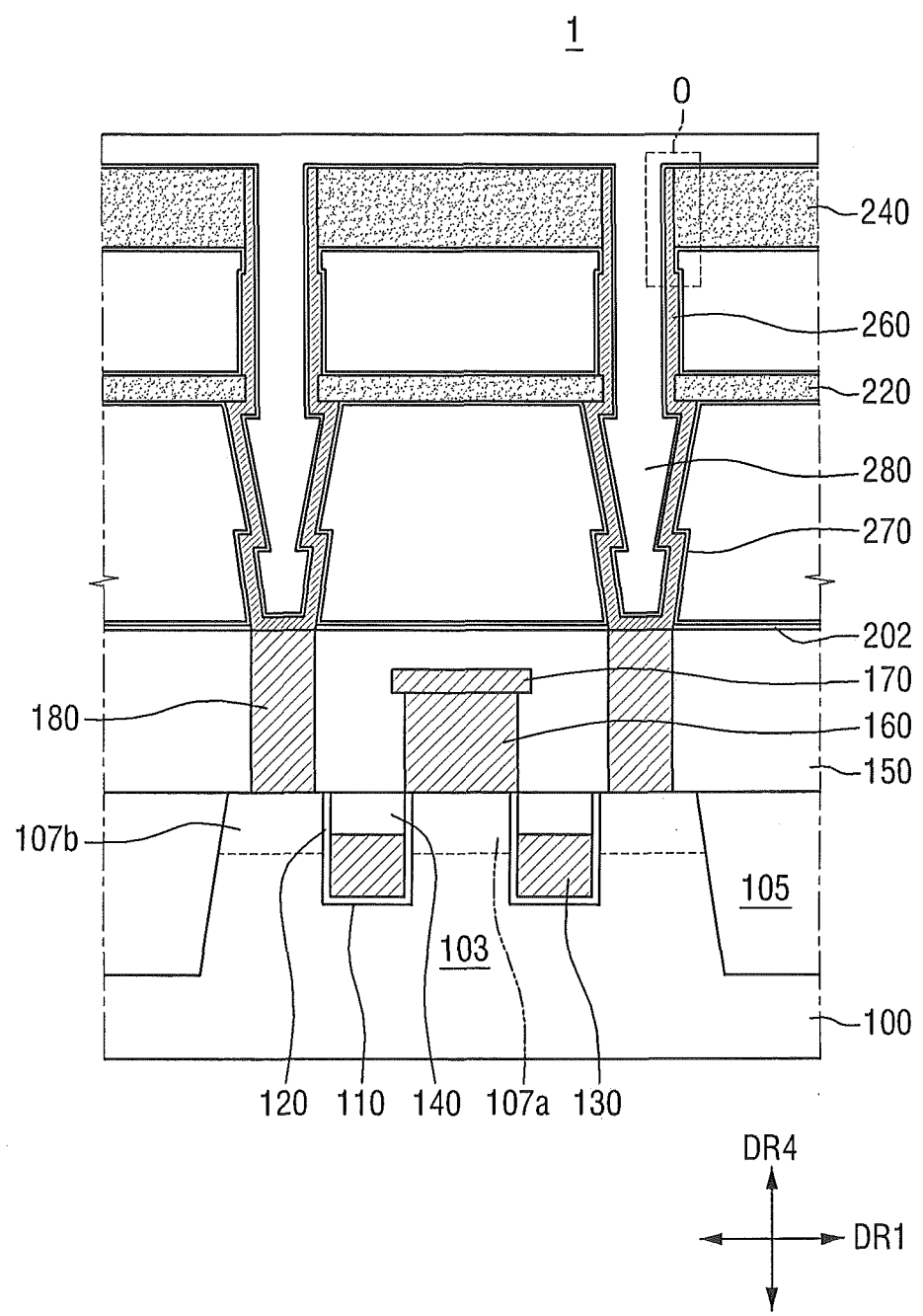
FIG. 2A is a view of a semiconductor device according to some embodiments of the inventive subject matter.

FIG. 2A is a view of a semiconductor device 1 according to some embodiments of the inventive subject matter. FIG. 2B is an enlarged view of a portion O of FIG. 2A. FIG. 2A is a cross-section of the semiconductor device 1 taken along the line A-A of FIG. 1.

Referring to FIG. 2A, the semiconductor device 1 includes a substrate 100, a bottom electrode 260, a first support pattern 220, a second support pattern 240, a capacitor dielectric film 270, and a top electrode 280.

The substrate 100 may be, but is not limited to, a stacked structure of a base substrate and an epitaxial layer. The substrate 100 may be a silicon substrate, a gallium arsenide substrate, a silicon germanium substrate, a ceramic substrate, a quartz substrate or a glass substrate for displays or may be a semiconductor on insulator (SOI) substrate. In the following description, a silicon substrate will be used as an example. In addition, the substrate 100 may have, but not limited to, a first conductivity type (e.g., a P type).

A bit line 170 and a gate electrode 130, which is used as a word line, may be disposed between the substrate 100 and the bottom electrode 260.

Specifically, a unit active region 103 and a device isolation region 105 are formed in the substrate 100. Two transistors may be formed in one unit active region 103. The two transistors respectively include two gate electrodes 130 which cross the unit active region 103, a first source/drain region 107*a* which is formed in the unit active region 103 between the two gate electrodes 130, and second source/drain regions 107*b* which are respectively formed between the gate electrodes 130 and the device isolation region 105. The two transistors share the first source/drain region 107*a* but do not share the second source/drain regions 107*b*.

A gate insulating film 120 may be formed along sidewalls and a bottom surface of each of first trenches 110 formed in the substrate 100. The gate insulating film 120 may include silicon oxide or a high-k dielectric having a higher dielectric constant than the silicon oxide. The gate electrodes 130 may partially fill each of the first trenches 110, i.e., the gate electrodes 130 may be recessed in the first trenches 110. The gate electrodes 130 may be made of, but not limited to, doped polysilicon, titanium nitride (TiN), tantalum nitride (TaN), tungsten nitride (WN), titanium (Ti), tantalum (Ta), or tungsten (W). Capping patterns 140 may be formed on the gate electrodes 130 to fill the first trenches 110. The capping patterns 140 may include an insulating material. For example, the capping patterns 140 may include at least one of silicon oxide, silicon nitride, and silicon oxynitride.

An interlayer insulating film 150 may be formed on the substrate 100. The interlayer insulating film 150 may include at least one of silicon oxide, silicon nitride, and silicon oxynitride. The interlayer insulating film 150 may be a single layer or a multilayer.

A first contact plug 160 may be formed in the interlayer insulating film 150 and electrically connected to the first source/drain region 107*a*. The first contact plug 160 may include a conductive material. For example, the first contact plug 160 may include, but is not limited to, at least one of polycrystalline silicon, a metal silicon compound, conductive metal nitride, and metal.

The bit line 170 may be formed on the first contact plug 160 and electrically connected to the first contact plug 160. The bit line 170 may include a conductive material. For example, the bit line 170 may include, but is not limited to, at least one of polycrystalline silicon, a metal silicon compound, conductive metal nitride, and metal.

Second contact plugs 180 may be formed in the interlayer insulating film 150 and pass through the interlayer insulating film 150. Respective ones of the second contact plugs 180 may be electrically connected to the second source/drain regions 107*b*. Each of the second contact plugs 180 may include a storage node contact. The second contact plugs 180 may include a conductive material. For example, the second contact plugs 180 may include, but not limited to, at least one of polycrystalline silicon, a metal silicon compound, conductive metal nitride, and metal.

The bottom electrode 260 may be formed on the substrate 100. Specifically, the bottom electrode 260 may be formed on the interlayer insulating film 150 which covers the gate electrode 130 and the bit line 170 and may be electrically connected to each of the second contact plugs 180 thereunder. The bottom electrode 260 may extend in a fourth direction DR4, i.e., the bottom electrode 260 may extend in a thickness direction (e.g., vertical in FIG. 2A) of the substrate 100. In the semiconductor device 1, the bottom electrode 260 may be cylindrical. The cylindrical bottom electrode 260 may have, but not limited to, stepped sidewalls. The bottom electrode 260 may include at least one of doped polysilicon, conductive metal nitride (such as titanium nitride, tantalum nitride or tungsten nitride), metal (such as ruthenium, iridium, titanium or tantalum), and conductive metal oxide (such as iridium oxide).

The first support pattern 220 and the second support pattern 240 may be disposed between adjacent bottom electrodes 260. The first support pattern 220 and the second support pattern 240 may be formed on outer walls of each bottom electrode 260 to connect the outer walls of the bottom electrode 260 to outer walls of adjacent ones of the bottom electrodes 260. The first support pattern 220 and the second support pattern 240 may contact the bottom electrode 260.

The first support pattern 220 and the second support pattern 240 may be separated from each other in the fourth direction DR4. For example, the first support pattern 220 may be closer to a top surface of the substrate 100 than the second support pattern 240. In the semiconductor device 1, a height of the bottom electrode 260 from the substrate 100 may be equal to a height of the second support pattern 240 from the substrate 100. In other words, the second support pattern 240 may be formed at the top of the bottom electrode 260. The first support pattern 220 may include at least one of silicon oxynitride, silicon nitride, silicon carbon nitride, and tantalum oxide. The second support pattern 240 may include, but not limited to, silicon nitride.

Figure 2B:
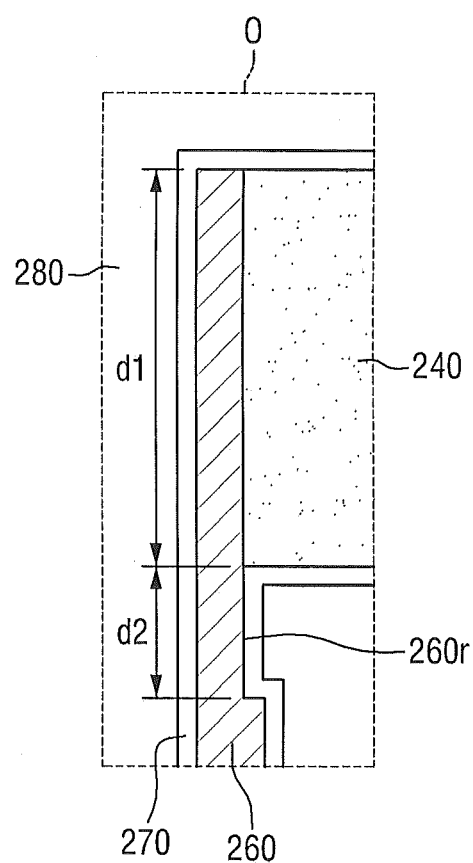
FIG. 2B is an enlarged view of a portion 0 of FIG. 2A.

As shown in FIG. 2B, the bottom electrode 260 may include a recessed portion 260*r* formed under a portion of the bottom electrode 260 that contacts the second support pattern 240. The recessed portion 260*r* will be described in detail later with reference to FIG. 2B.

In the semiconductor device 1, the second support pattern 240 may have a thickness of 100 to 500 Å, and the first support pattern 220 may have a thickness of 100 to 200 Å. However, the inventive subject matter is not limited thereto.

The capacitor dielectric film 270 may be formed on the bottom electrode 260, the first support pattern 220, and the second support pattern 240. Specifically, the capacitor dielectric film 270 may be formed along the outer and inner walls of the bottom electrode 260. The capacitor dielectric film 270 may conform to the bottom electrode 260, the first support pattern 220 and the second support pattern 240. The capacitor dielectric film 270 may consist of a single layer or may include multiple layers. The capacitor dielectric film 270 may include at least one of silicon oxide, silicon nitride, silicon oxynitride, and a high-k material. The high-k material may include, but not limited to, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The top electrode 280 may be formed on the capacitor dielectric film 270. The top electrode 280 may be formed between the sidewalls of the cylindrical bottom electrode 260. The top electrode 280 may be surrounded by the sidewalls of the bottom electrode 260. The top electrode 280 may include at least one of doped polysilicon, metal, conductive metal nitride, and metal silicide.

Referring to FIG. 2B, the recessed portion 260*r* may be disposed under a portion of the bottom electrode 260 that contacts the second support pattern 240. The capacitor dielectric film 270 may conform to the recessed portion 260*r*. An extent of the recessed portion 260*r* may be d2, and a thickness of the second support pattern 240 may be d1.

In the semiconductor device 1, a value $X = d2 \div (d1 + d2)$ obtained by dividing the extent of the recessed portion 260*r* by the sum of the extent of the recessed portion 260*r* and the thickness of the second support pattern 240 may be 0.1 to 0.9. As the value of X increases, the thickness of the second support pattern 240 is reduced. In this case, the area of the bottom electrode 260 having the capacitor dielectric film 270 formed thereon increases, thereby increasing the capacitance of a capacitor. In the opposite case, the area of the bottom electrode 260 having the capacitor dielectric film 270 is reduced, thereby reducing the capacitance of the capacitor.

A semiconductor device according to further embodiments of the inventive subject matter will now be described with reference to FIG. 3. Like items substantially those of the previously described embodiments are indicated by like reference numerals, and repeated description thereof may be omitted.

FIG. 3 is a view of a semiconductor device 2 according to further embodiments of the inventive subject matter.

Referring to FIG. 3, the semiconductor device 2 includes a substrate 100, a bottom electrode 260, a first support pattern 220, a second support pattern 240, a capacitor dielectric film 270, and a top electrode 280.

The bottom electrode 260 may extend in a fourth direction DR4 and may be electrically connected to each of second contact plugs 180. In the semiconductor device 2, the bottom electrode 260 may be pillar-shaped. The pillar-shaped bottom electrode 260 may have uneven sidewalls. The sidewalls of the pillar-shaped bottom electrode 260 may be stepped or take other forms.

Unlike in FIG. 2A, in FIG. 3, the capacitor dielectric film 270 may be formed only on outer walls of the bottom electrode 260.

The top electrode 280 may be formed on the bottom electrode 260 having the capacitor dielectric film 270 formed thereon. Unlike in FIG. 2A, in FIG. 3, the top electrode 280 is not surrounded by the sidewalls of the bottom electrode 260.

Operations for fabricating a semiconductor device according to some embodiments of the inventive subject matter will now be described with reference to FIGS. 2A and 4 through 12.

FIGS. 4 through 12 are views illustrating intermediate processes for fabricating a semiconductor device according to some embodiments of the inventive subject matter. FIG. 9B is a cross-sectional view taken along the line C-C of FIG. 9A. FIG. 11B is a cross-sectional view taken along the line C-C of FIG. 11A.

Figure 4:
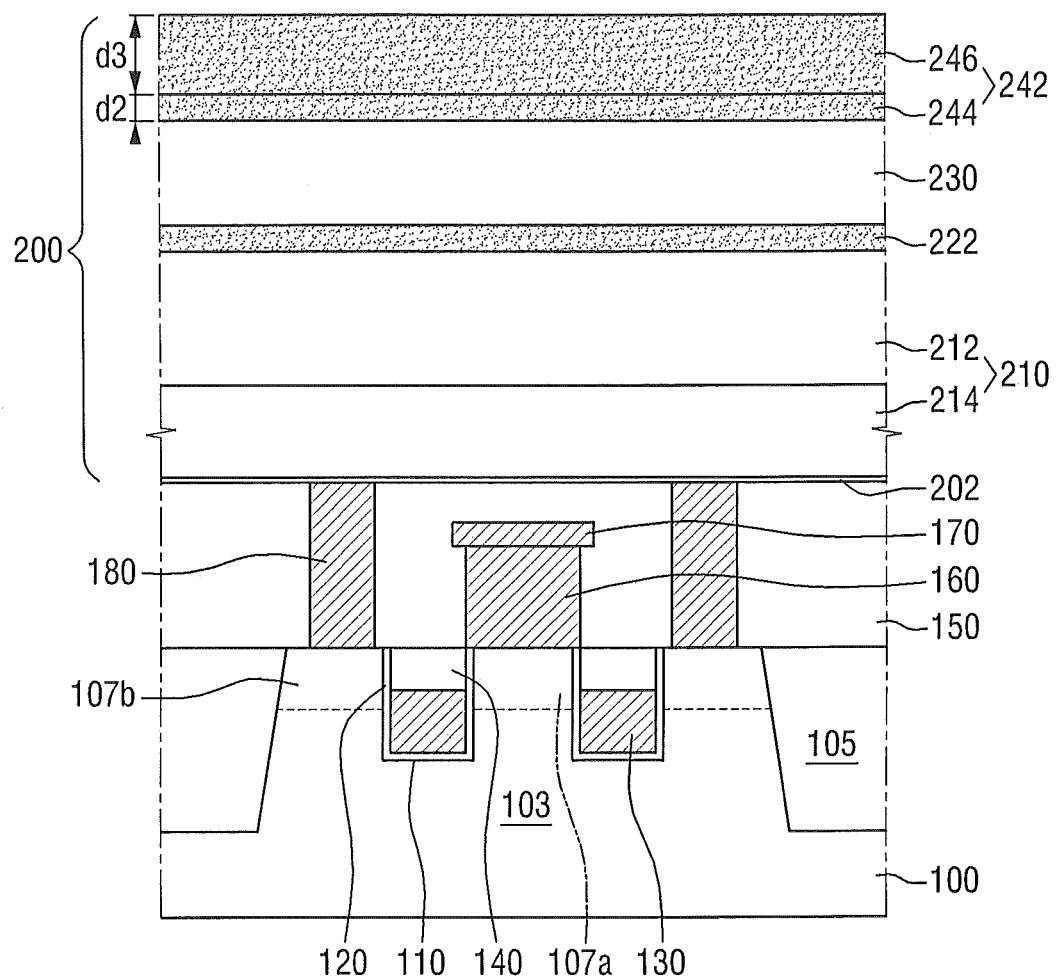
FIGS. 4 through 12 are views illustrating intermediate processes included in a method of fabricating a semiconductor device according to some embodiments of the inventive subject matter.

Referring to FIG. 4, an insulating layer 200 is formed on a substrate 100. The insulating layer 200 may include a first mold film 210, a first support film 222, a second mold film 230, and a second support film 242 stacked sequentially.

Specifically, an etch stop film 202 may be formed on an interlayer insulating film 150 in which a first contact plug 160 and second contact plugs 180 are formed, and the first mold film 210, the first support film 222, the second mold film 230, and the second support film 242 may be formed sequentially on the etch-stop film 202. The etch-stop film 202 may include a material having an etch selectivity with respect to the first mold film 210 and the second mold film 230 which include oxide. The etch-stop film 202 may be formed by chemical vapor deposition (CVD) and may include, for example, silicon nitride.

The first mold film 210 may be formed on the etch-stop film 202. The first mold film 210 may include silicon oxide. For example, the first mold film 210 may include flowable oxide (FOX), tonen silazen (TOSZ), undoped silica glass (USG), borosilica glass (BSG), phosphosilica glass (PSG), borophosphosilica glass (BPSG), plasma enhanced tetraethyl orthosilicate (TEOS), fluoride silicate glass (FSG), high density plasma (HDP), plasma enhanced oxide (PEOX), flowable CVD, or a combination of the same.

The first mold film 210 may include an upper first mold film 212 and a lower first mold film 214 which have different etch rates. For example, the lower first mold film 214 may include oxide doped with impurities, and the upper first mold film 212 may include oxide undoped with impurities. The lower first mold film 214 may include BPSG or PSG, and the upper first mold film 212 may include PE-TEOS or HDP-CVD oxide. In a subsequent etching process, the lower first mold film 214 may be etched faster than the upper first mold film 212. Due to the difference between the etch rates of the lower first mold film 214 and the upper first mold film 212, contact holes 250 (see FIG. 6) may have stepped or pyramid-shaped sidewalls.

The first support film 222 may be formed on the first mold film 210. In a subsequent process, the first support film 222 may be formed into a first support pattern 220 (see FIG. 2A). The first support film 222 can change the shape of the contact holes 250 (see FIG. 6) which are to be formed later or the time required to form the contact holes 250. Therefore, the position of the first support film 222 may be adjusted as desired. The first support film 222 may include a material having an etch selectivity with respect to the first mold film 210 and the second mold film 230. If the first mold film 210 and the second mold film 230 include oxide, the first support film 222 may include at least one of silicon oxynitride, silicon nitride, silicon carbon nitride, and tantalum oxide.

The second mold film 230 may be formed on the first support film 222. The second mold film 230 may include an oxide that may be included in the first mold film 210. The second mold film 230 may include, e.g., PE-TEOS or HDP-CVD oxide. The second mold film 230 may be formed using oxide having a different impurity concentration from the oxide used to form the first mold film 210 which includes the upper first mold film 212 and the lower first mold film 214. Therefore, the first mold film 210 and the second mold film 230 may be etched at different rates.

The second support film 242 may be formed on the second mold film 230. The second support film 242 may include a lower second support film 244 and an upper second support film 246. A first thickness of the upper second support film 246 may be d3, and a second thickness of the lower second support film 244 may be d2. A ratio of the thickness of the lower second support film 244 to the total thickness of the second support film 242 may be in a range of 0.1 to 0.9. The thickness of the lower second support film 244 may be 0.1 to 0.9 times the total thickness of the second support film 242.

The thickness d2 of the lower second support film 244 may be equal to the extent d2 of a recessed portion 260r shown in FIG. 2B. This will be described later with reference to FIGS. 6 and 10.

The upper second support film 246 may be formed directly on the lower second support film 244 to contact the second support film 244.

The second support film 242 may include a material having an etch selectivity with respect to the first mold film 210 and the second mold film 230. The upper second support film 246 may include, for example, silicon nitride, and the lower second support film 244 may include silicon oxynitride. In particular, the silicon oxynitride included in the lower second support film 244 may have a low density. Specifically, the specific gravity of silicon oxynitride having a low density may be about 1.2 to about 1.4, whereas the specific gravity of general silicon oxynitride is about 2.3. In addition, the atomic fraction (at %) of nitrogen in the silicon oxynitride having a low density may be about 38 to about 50%. When an etchant for etching silicon oxide is used, the silicon oxynitride having a low density may be etched about 20 times faster than the general silicon oxynitride.

Silicon oxynitride having a low specific gravity may be formed by CVD using silane ($SiH_4$), ammonia ($NH_3$) and nitrogen oxide ($N_2O$) as a reaction gas and using nitrogen ($N_2$) or a mixed gas ($N_2$+He) of nitrogen and helium as a carrier gas. The reaction pressure for forming the silicon oxynitride having a low specific gravity may be, but is not limited to, about 0.5 to about 10 torr.

Figure 5:
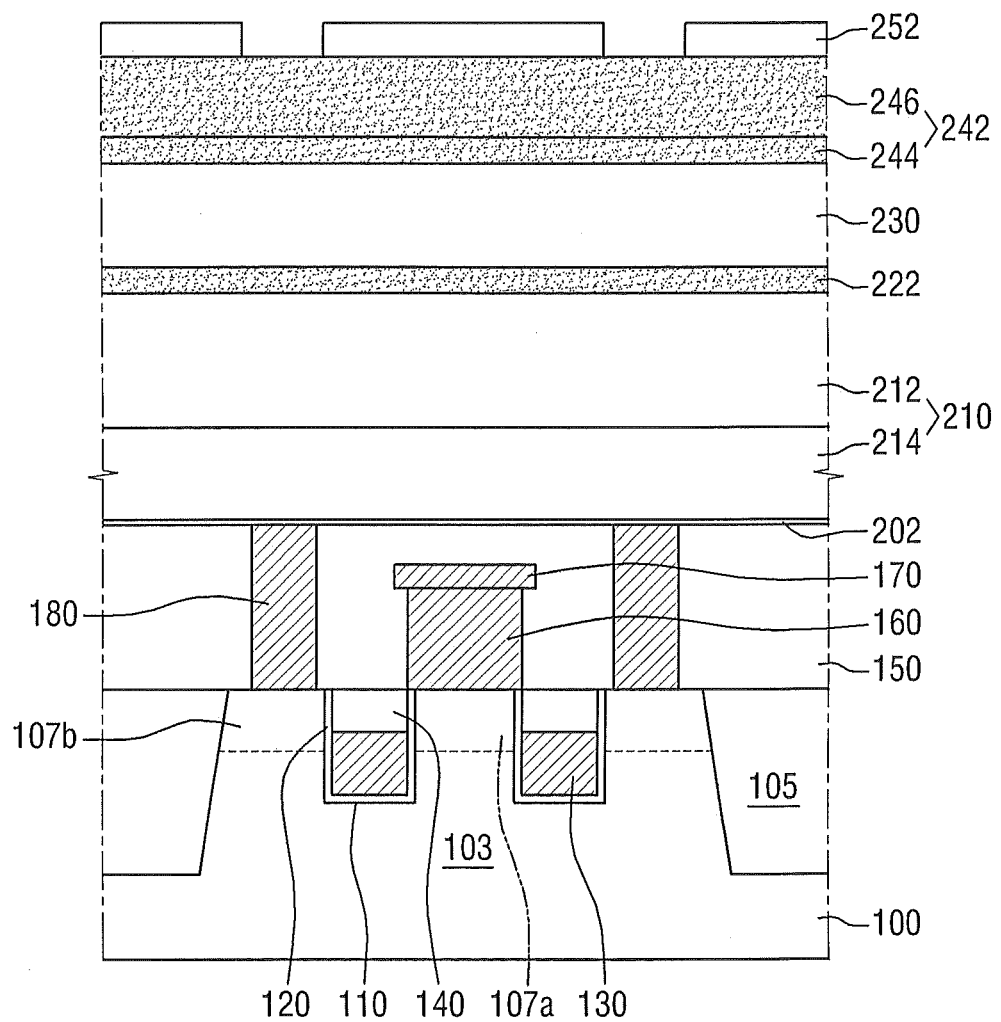

Referring to FIG. 5, a node mask 252 may be formed on the insulating layer 200. Specifically, the node mask 252 may be formed on the second support film 242.

Specifically, a mask layer (not shown) is formed on the insulating layer 200. The mask layer may include a material having an etch selectivity with respect to the second support film 242. The mask layer is etched to form the node mask 252 on the second support film 242. The node mask 252 defines regions in which the contact holes 250 (see FIG. 6) for forming bottom electrodes 260 (see FIG. 8) are to be formed.

Figure 6:
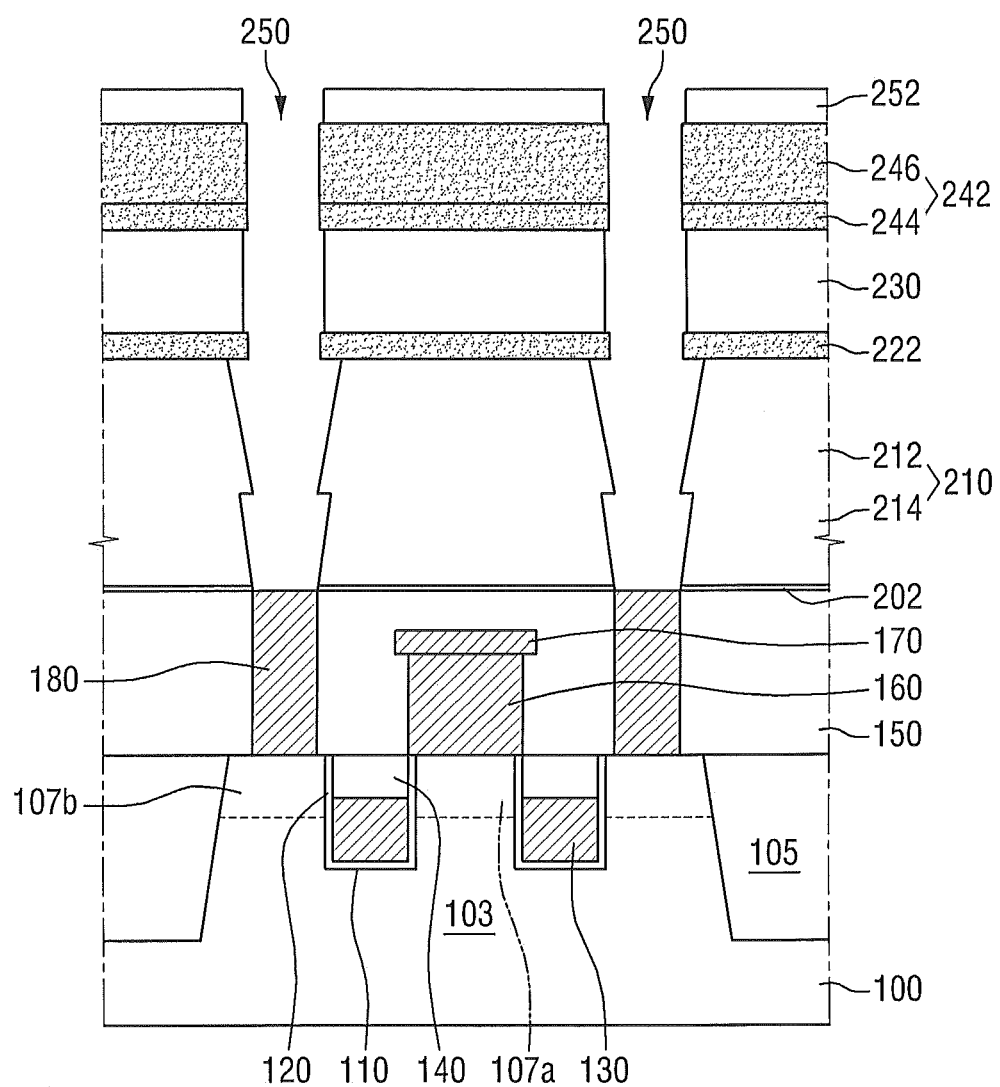

Referring to FIG. 6, the contact holes 250 are formed in the insulating layer 200. The contact holes 250 are formed by etching the insulating layer 200 using the node mask 252 as a mask. That is, the contact holes 250 are formed in the insulating layer 200 by etching the second support film 242, the second mold film 230, the first support film 222 and the first mold film 210. The contact holes 250 may expose the second contact plugs 180.

The etching process for forming the contact holes 250 may include at least one of a wet-etching process and a dry-etching process. Specifically, the upper second support film 246 which includes silicon nitride may be etched using an etching gas for etching nitride. The lower second support film 244, the second mold film 230, the first support film 222, the first mold film 210, and the etch-stop film 202 may be etched by respective etching processes. If the contact holes 250 are formed through multiple steps of etching process as described above, the uniformity of the etching process for forming the contact holes 250 can be improved.

After the etching, a cleaning process may be performed. The cleaning process may remove byproducts (such as a natural oxide film and polymer) from the substrate 100 having the contact holes 250. If a cleaning solution which includes deionized water and an ammonia aqueous solution or sulfuric acid is used in the cleaning process, the first mold film 210 and the second mold film 230 may be partially etched, thereby increasing the diameter of the contact holes 250. The first support film 222 and the second support film 242 which include a material having an etch selectivity with respect to the first mold film 210 and the second mold film 230 may not be etched during the cleaning process. Therefore, the first support film 222 and the second support film 242 may partially expand in a horizontal direction to the substrate 100. As a result, the first support film 222 and the second support film 242 may protrude inwardly of each of the contact holes 250.

The lower second support film 244 can be partially etched during the cleaning process. In this case, a distance by which the lower second support film 244 protrudes inwardly of each of the contact holes 250 may be smaller than a distance by which the upper second support film 246 protrudes inwardly of each of the contact holes 250. Alternatively, if the lower second support film 244 and the second mold film 230 are etched substantially equally during the cleaning process, only the upper second support film 246 may partially expand in the horizontal direction to the substrate 100 to protrude inwardly of each of the contact holes 250.

Figure 7:
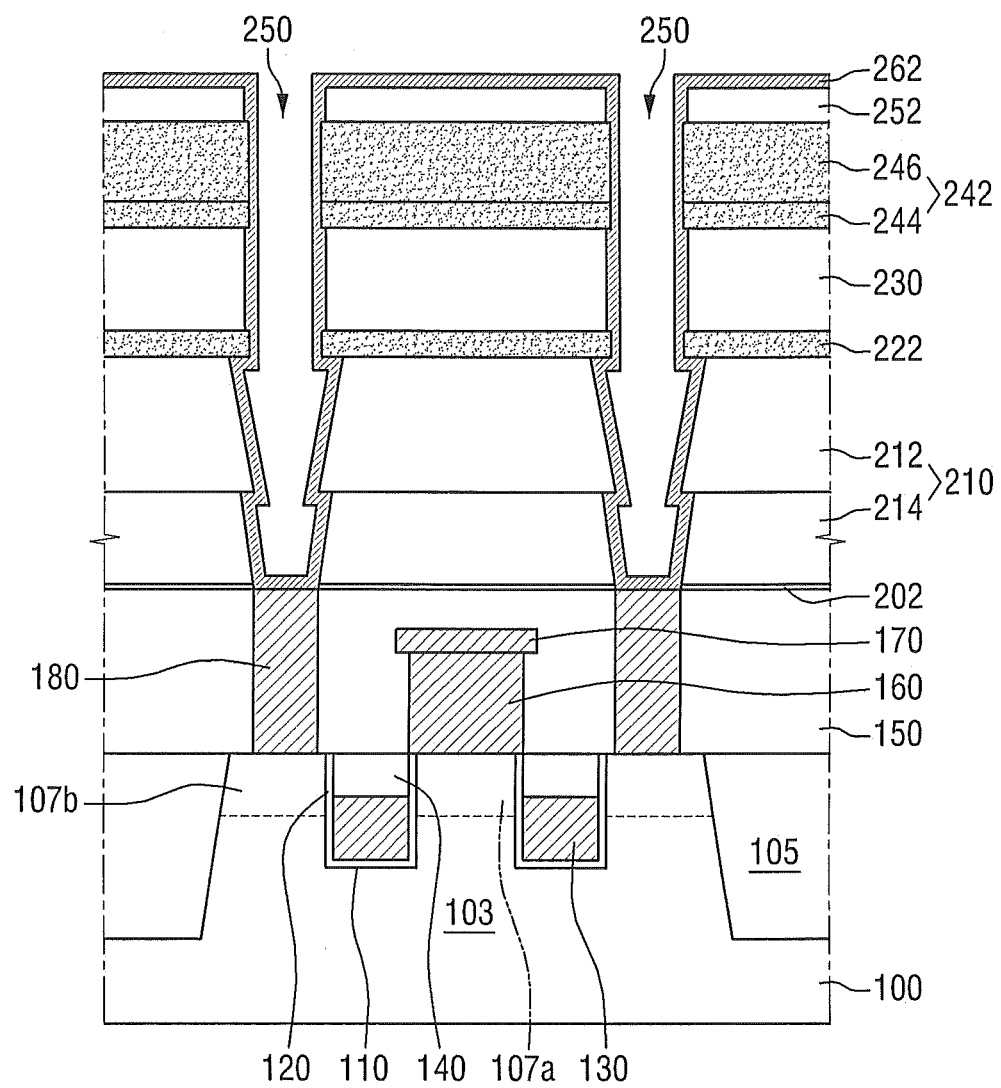

Referring to FIG. 7, a bottom electrode film 262 is formed on exposed top surfaces of the second contact plugs 180, inner walls of the contact holes 250, the protruding first support film 222, the protruding second support film 242, and the node mask 252. The bottom electrode film 262 may be a conductive material and may include at least one of doped polysilicon, conductive metal nitride (such as titanium nitride, tantalum nitride or tungsten nitride), metal (such as ruthenium, iridium, titanium or tantalum), and conductive metal oxide (such as iridium oxide).

Since the first support film 222 and the second support film 242 laterally protrude inwardly of each of the contact holes 250, the bottom electrode film 262 may be formed to cover protruding portions of the first and second support films 222 and 242.

Figure 8:
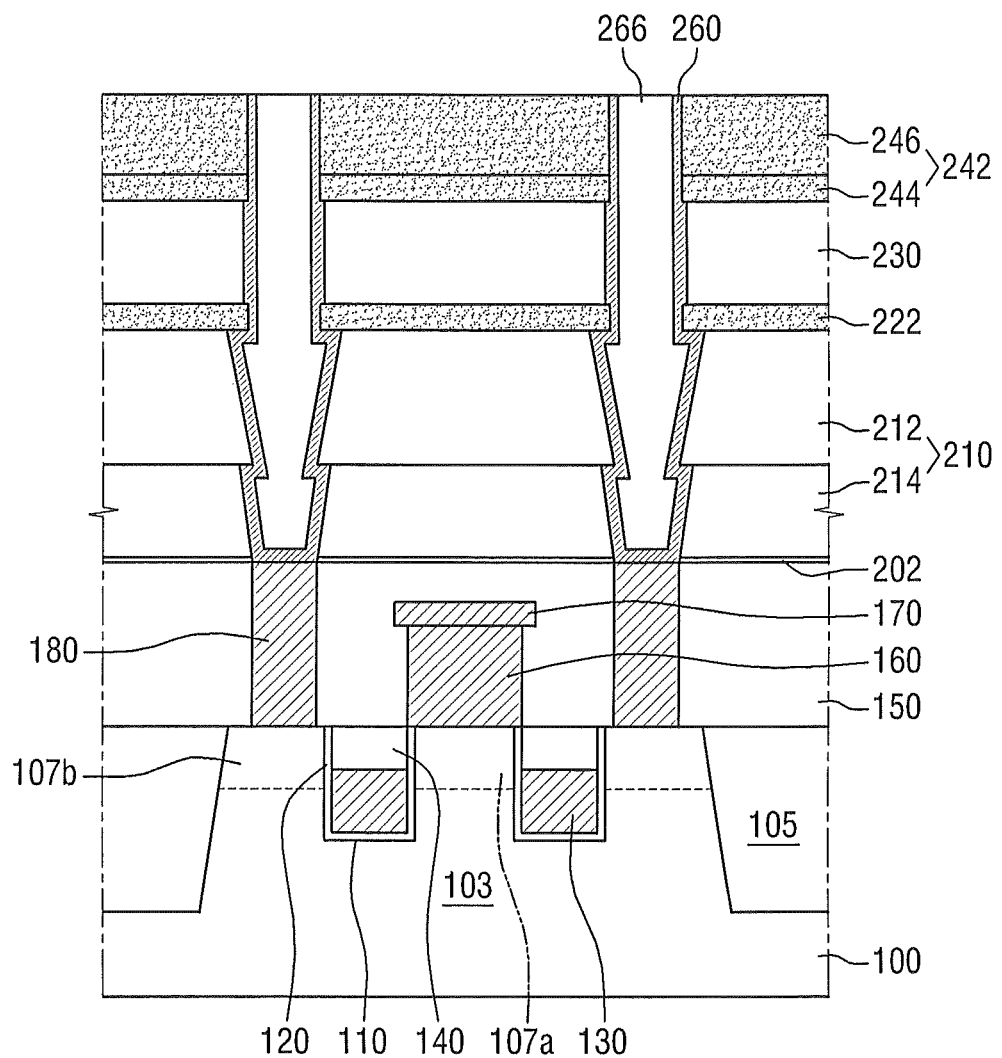

Referring to FIG. 8, a sacrificial film 266 is formed on the bottom electrode film 262 in the contact holes 250. The sacrificial film 266 may include a material having a good gap-filling capability. For example, the sacrificial film 266 may include oxide such as USG or spin on glass (SOG). The sacrificial film 266 may protect a bottom electrode 260 during a polishing process and an etching process for completing the bottom electrode 260.

By using a process which includes at least one of a chemical mechanical polishing (CMP) process and an etch-back process, the node mask 252 on the second support film 242, the bottom electrode film 262 and the sacrificial film 266 may be removed until the second support film 242 is exposed. As a result, the bottom electrode 260 may be formed in each of the contact holes 250 to be electrically connected to each of the second contact plugs 180. In addition, each bottom electrode 260 may be electrically isolated from another bottom electrode 260. Each of the contact holes 250 in which the bottom electrode 260 is formed may be filled with the sacrificial film 266.

Figure 9A:
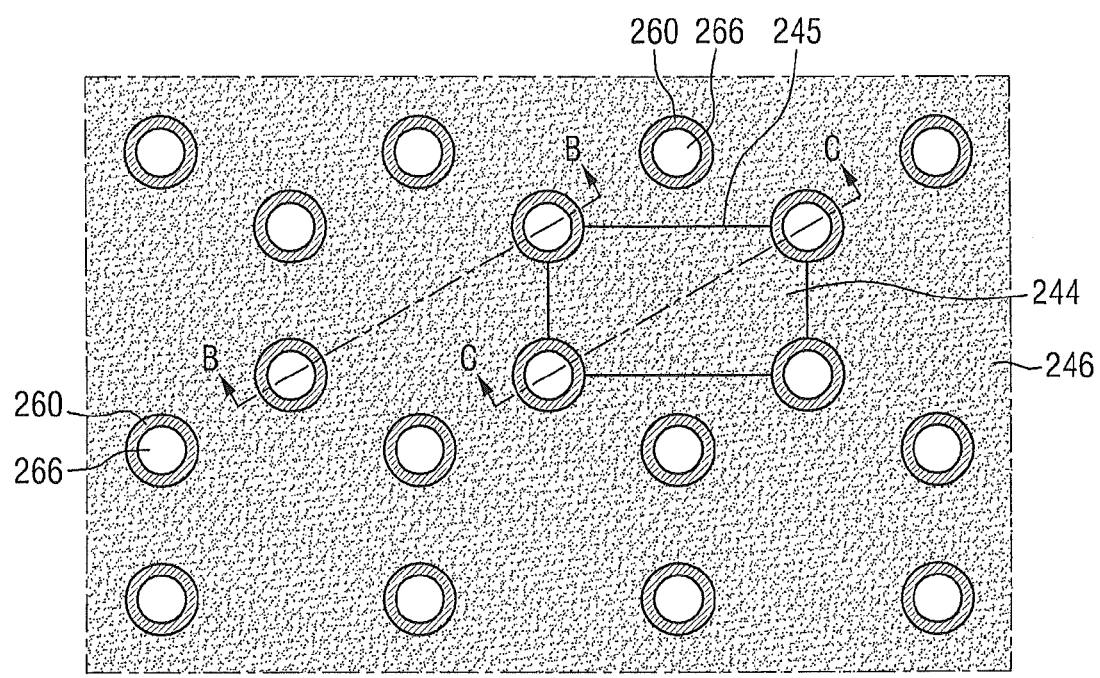

The bottom electrode 260 is formed at the position of each of the second contact plugs 180 shown in FIG. 1. FIG. 9A shows the bottom electrodes 260 arranged in a honeycomb pattern.

Figure 9B:
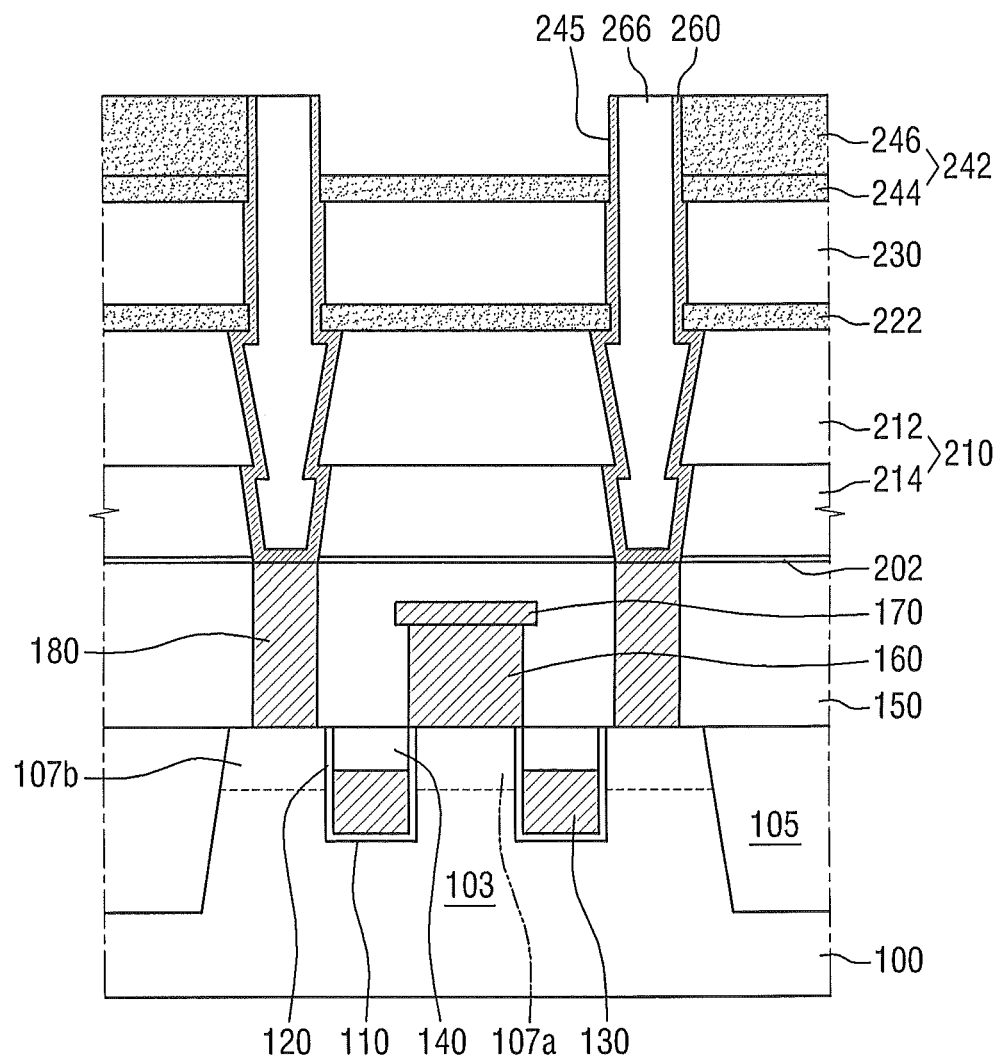

Referring to FIGS. 9A and 9B, a second trench 245 is formed in the second support film 242. The second trench 245 exposes the lower second support film 244 of the second support film 242. The second trench 245 may serve as an inlet/outlet for an etchant used to remove the lower second support film 244 and the second mold film 230 in a subsequent process.

Specifically, a mask pattern (not shown) for forming the second trench 245 may be formed on the second support film 242. Using the mask pattern as an etch mask, a portion of the second support film 242, that is, the upper second support film 246 may be removed. The removal of the upper second support film 246 may expose the lower second support film 244. The etching process for removing the upper second support film 246 may be, for example, a dry-etching process.

When seen in a plane view, the second trench 245 is a quadrilateral and is formed over four bottom electrodes 260. However, this is merely an example used for ease of description, and the inventive subject matter is not limited to this example. The second trench 245 may be formed in a portion of the second support film 242. In a subsequent process, the upper second support film 246 of the second support film 242 is formed into a second support pattern 240 in order to ensure structural stability of the bottom electrode 260. Therefore, the size and number of the second trenches 245 need to be adjusted.

A cross-section taken along the line B-B of FIG. 9A is identical to the cross-section of FIG. 8. This is because the second trench 245 is not formed in a portion taken along the line B-B.

Referring to FIG. 9B, sidewalls of the second trench 245 may consist of adjacent bottom electrodes 260 and the upper second support film 246, and a bottom surface of the second trench 245 may be a top surface of the lower second support film 244. A portion of the upper second support film 246 that is located directly above the first contact plug 160 may be removed.

Figure 10:
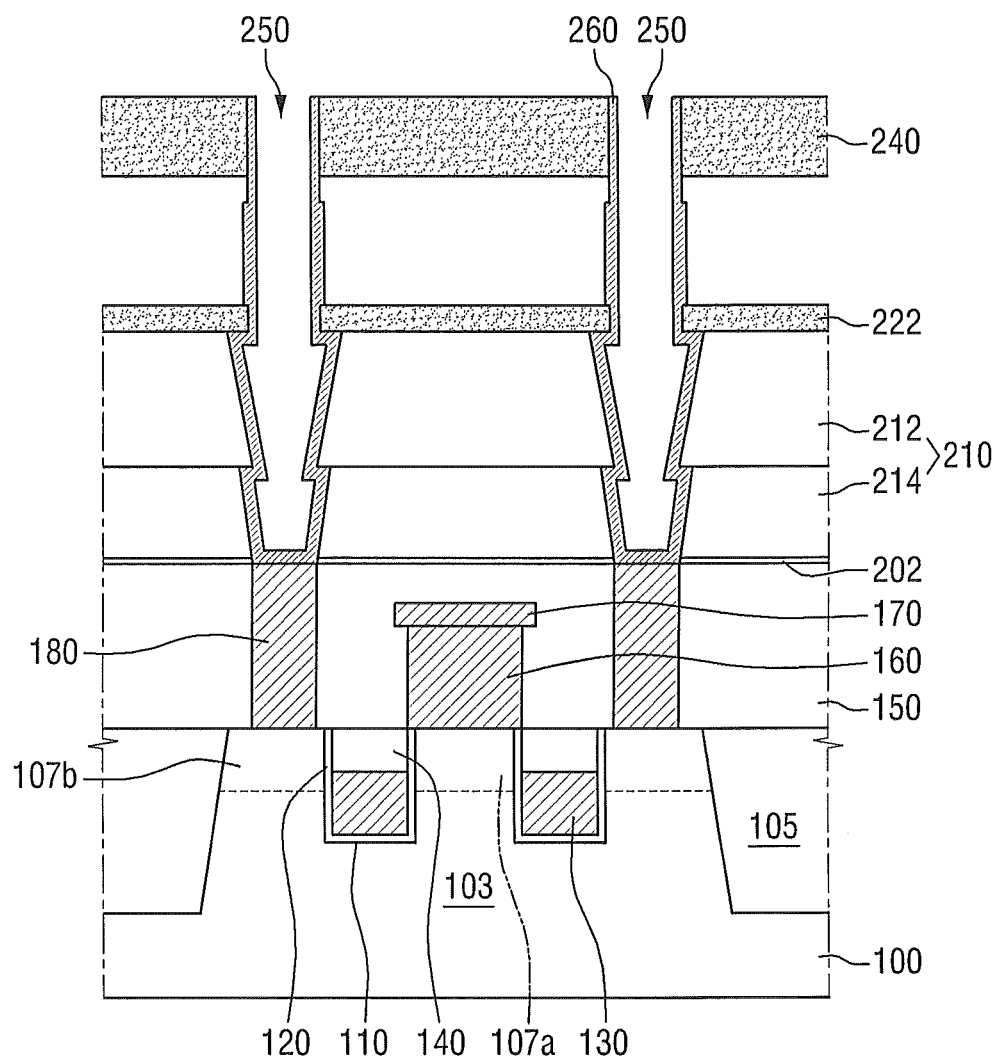

Referring to FIG. 10, a portion of the second support film 242 and the second mold film 230 are removed, thereby forming the second support pattern 240 that surrounds the bottom electrode 260. In other words, the upper second support film 246 remaining after the lower second support film 244 and the second mold film 230 are removed may become the second support pattern 240. The etching process for forming the second support pattern 240 may be, but is not limited to, a wet-etching process.

The second support pattern 240 is separated from the first support film 222 and the first mold film 210. A space is formed between the second support pattern 240 and the first support film 222. The second support pattern 240 may be supported by the bottom electrode 260. The second support pattern 240 may be formed to contact an end portion of the bottom electrode 260. As a result of the removal of the lower second support film 244, a recess may be formed directly under a portion of the bottom electrode 260 which contacts the second support pattern 240. However, the inventive subject matter is not limited thereto.

Specifically, an etchant may be injected through the second trench 245 formed in the second support film 242. The etchant may have a high etch rate for, for example, silicon oxide. As described above with reference to FIG. 4, the lower second support film 244 includes a silicon oxynitride film having a low density. Using the etchant for etching silicon oxide, the silicon oxynitride film having a low density can be etched easily.

Figure 11A:
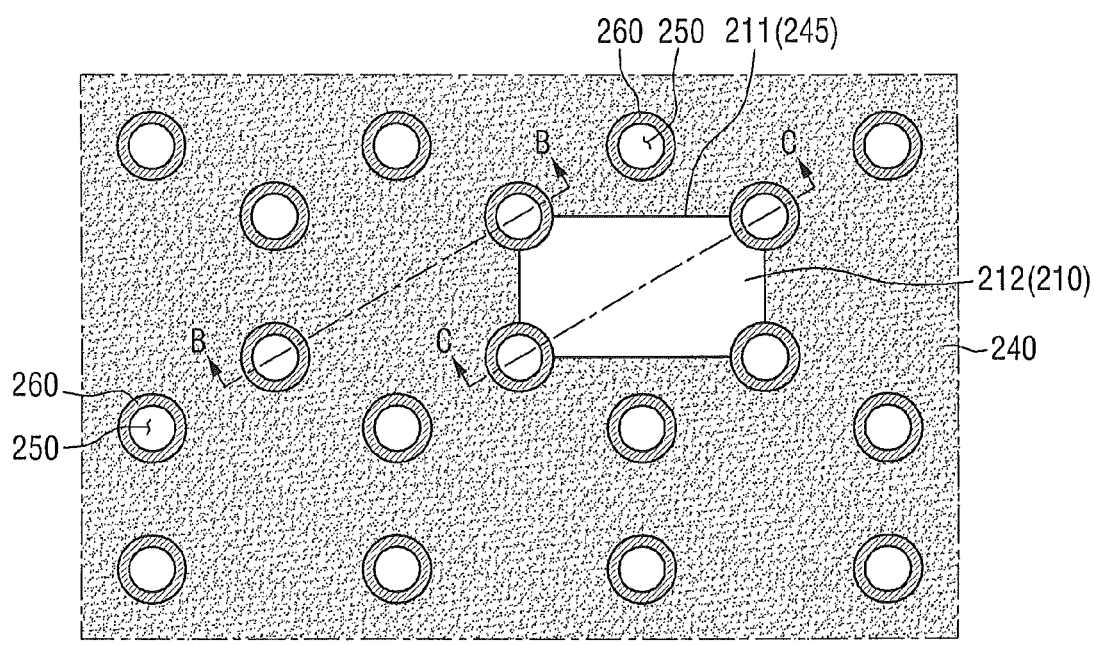
Figure 11B:
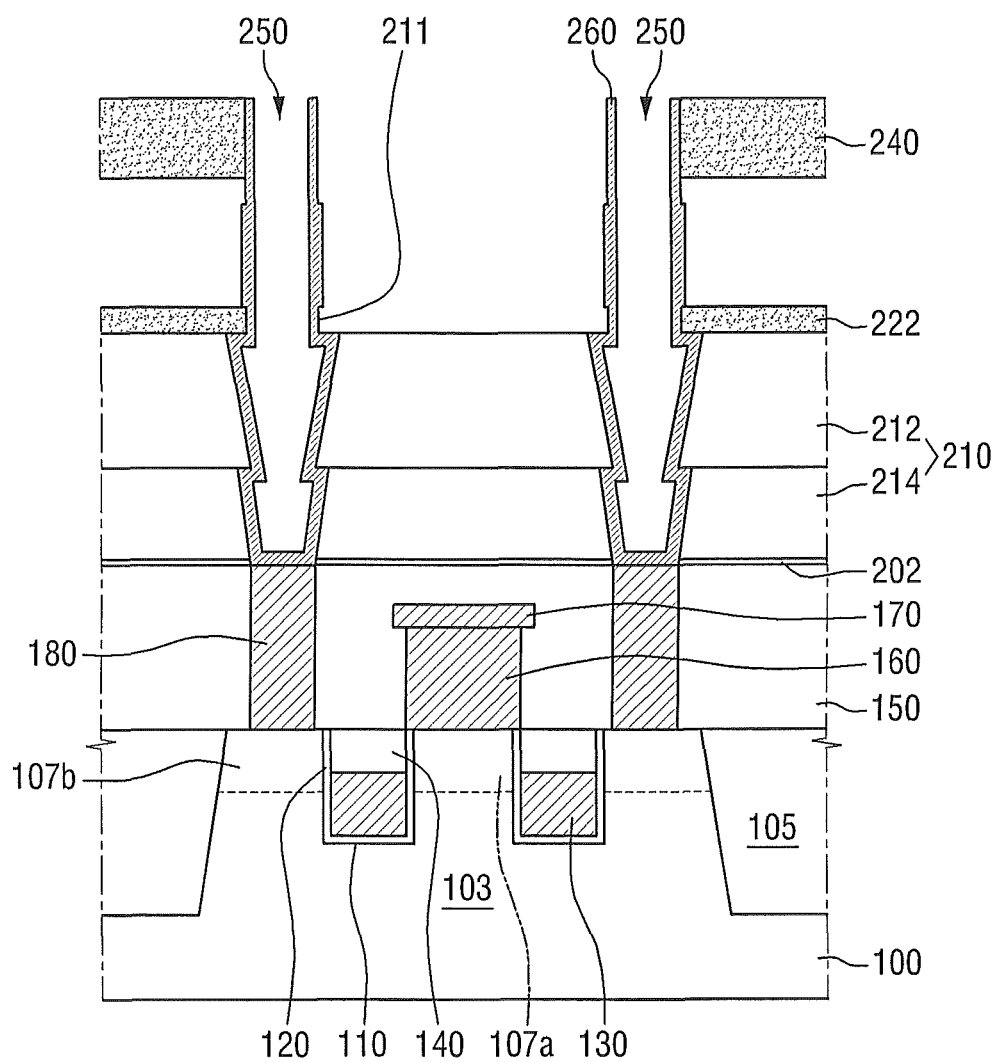

Referring to FIGS. 11A and 11B, a third trench 211 is formed in the first support film 222. The third trench 211 exposes the first mold film 210. The third trench 211 may serve as an inlet/outlet for an etchant used to remove the first mold film 210 in a subsequent process.

Specifically, the third trench 211 is formed by removing the first support film 222 using the second support pattern 240 which includes the second trench 245 as an etch mask. The third trench 211 thus formed exposes the first mold film 210. The etching process for removing the first support film 222 may be, for example, a dry-etching process.

A cross-section taken along the line B-B of FIG. 11A is identical to the cross-section of FIG. 10. This is because the second trench 245 and the third trench 211 are not formed in a portion taken along the line B-B.

Referring to FIG. 11B, sidewalls of the third trench 211 may consist of adjacent bottom electrodes 260 and the first support film 222, and a bottom surface of the third trench 211 may be a top surface of the first mold film 210. A portion of the first support film 222 that is located directly above the first contact plug 160 may be removed. In a region in which the third trench 211 is formed, the second trench 245 already exists. Therefore, there may be no structure directly above the exposed first mold film 210.

Figure 12:
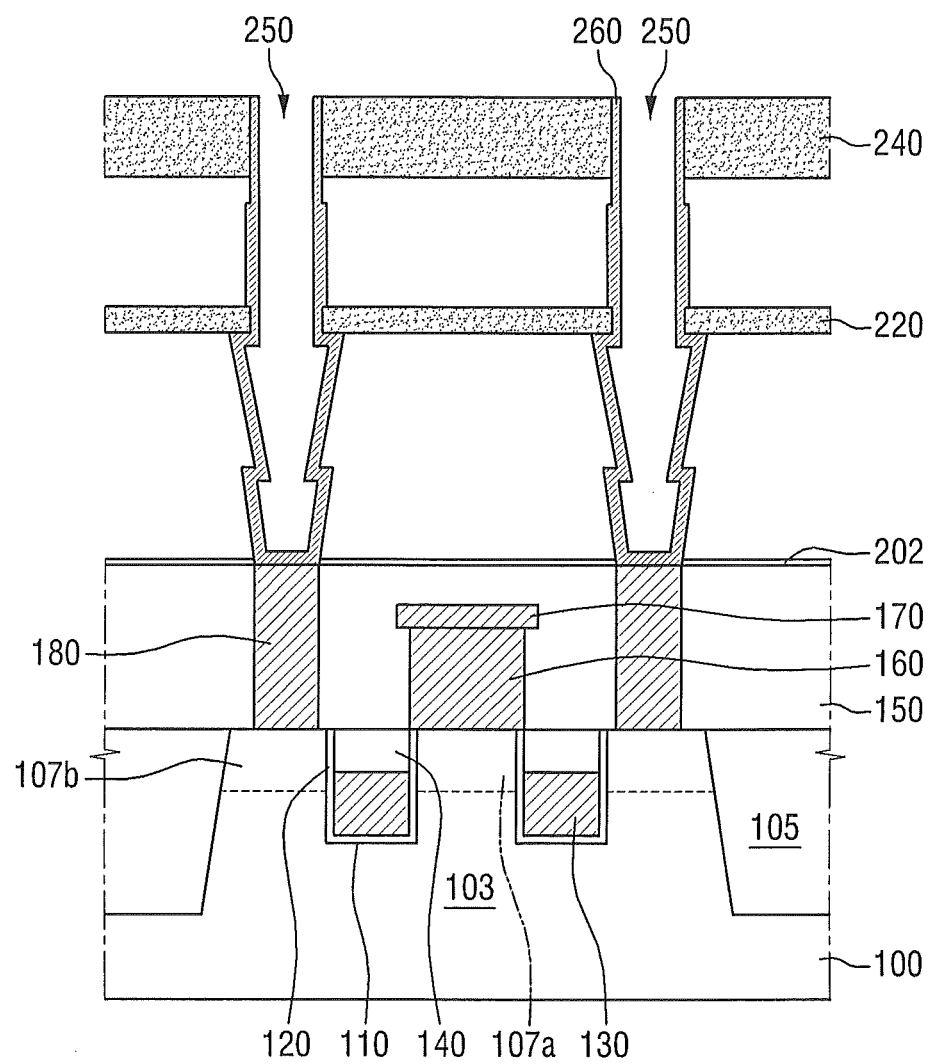

Referring to FIG. 12, the first support pattern 220 is formed to surround the bottom electrode 260 by removing the first mold film 210. The first support film 222 remaining after the first mold film 210 is removed may become the first support pattern 220. The etching process for forming the first support pattern 220 may be, but is not limited to, a wet-etching process.

The first support pattern 220 is separated from the etch-stop film 202 and the second support pattern 240. A space is formed between the first support pattern 220 and the etch-stop film 202. The first support pattern 220 may be supported by sidewalls of the bottom electrode 260. All elements formed on the etch-stop film 202, that is, the first mold film 210, the second mold film 230, and the lower second support film 244 may be removed from a memory cell region of the dynamic random access memory (DRAM), except for the cylindrical bottom electrode 260, the first support pattern 220 and the second support pattern 240.

The first support pattern 220 and the second support pattern 240 which surround adjacent bottom electrodes 260 may keep the bottom electrodes 260 from sloping, thereby stabilizing the bottom electrode structure.

Referring to FIG. 2A, a capacitor dielectric film 270 may be formed on the bottom electrode 260, the first support pattern 220 and the second support pattern 240. The capacitor dielectric film 270 may be formed conformally. Then, a top electrode 280 may be formed on the capacitor dielectric film 270.

Operations for fabricating a semiconductor device according to further embodiments of the inventive subject matter will now be described with reference to FIGS. 2A, 4 through 8, and 10 through 13B.

Figure 13A:
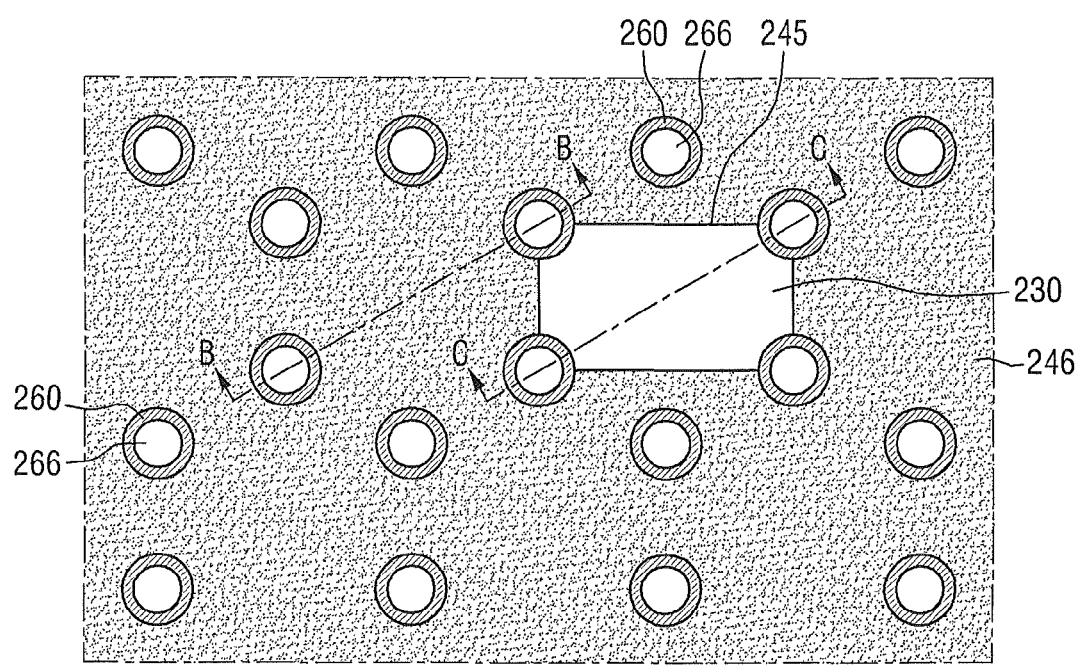
FIGS. 13A and 13B are views illustrating intermediate processes included in a method of fabricating a semiconductor device according to further embodiments of the inventive subject matter.
Figure 13B:
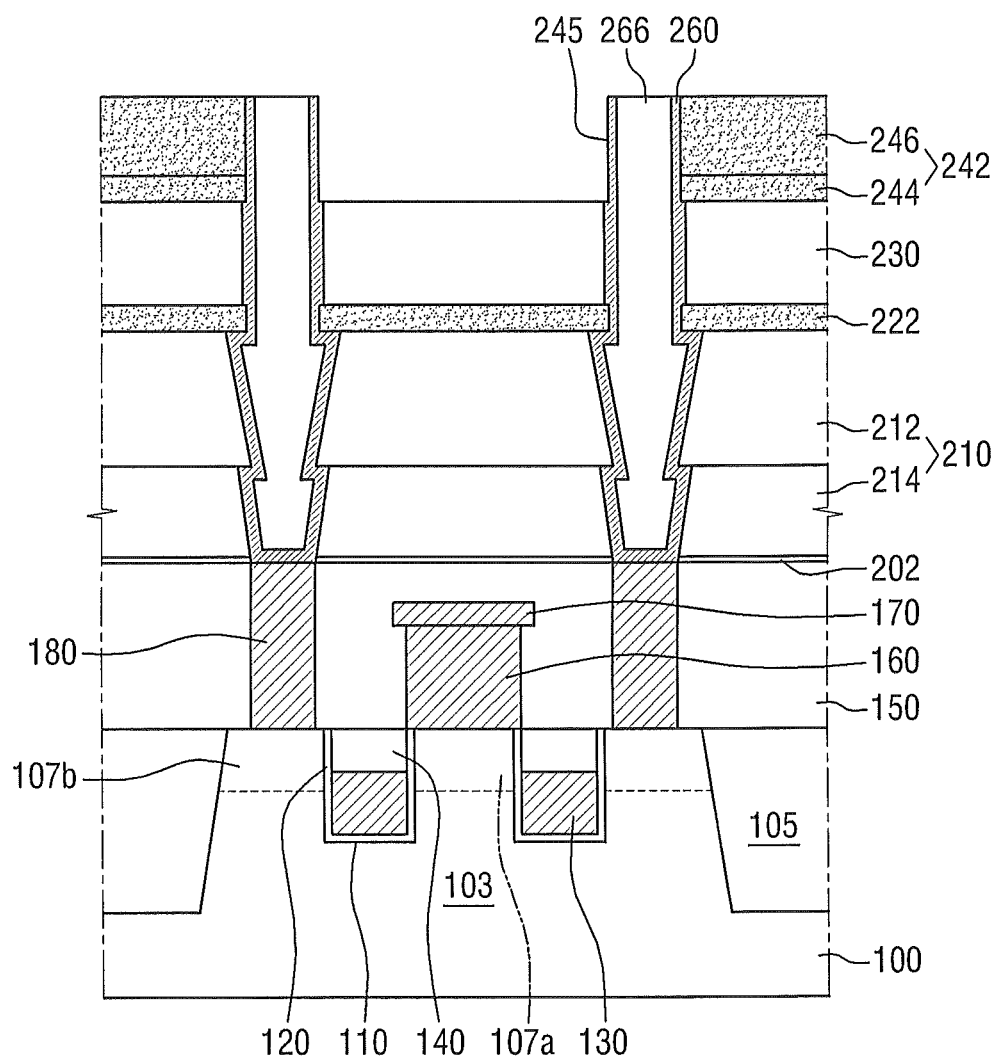

FIGS. 13A and 13B are views illustrating intermediate processes for fabricating a semiconductor device according to further embodiments of the inventive subject matter. Referring to FIGS. 13A and 13B, after an electrically isolated bottom electrode 260 is formed through the process of FIG. 8, a second trench 245 is formed in a second support film 242. The second trench 245 exposes a second mold film 230.

Specifically, an upper second support film 246 and a lower second support film 244 may be etched sequentially. As a result, the second trench 245 may be formed to expose the second mold film 230. The etching process for forming the second trench 245 may be, e.g., a dry-etching process.

A cross-section taken along the line B-B of FIG. 13A may be identical to the cross-section of FIG. 8.

Referring to FIG. 13B, sidewalls of the second trench 245 may consist of sidewalls of adjacent bottom electrodes 260 and the second support film 242, and a bottom surface of the second trench 245 may be a top surface of the second mold film 230. A portion of the second support film 242 which is located above a first contact plug 160 may be removed. A second support pattern 240 may be formed by removing the second mold film 230.

Operations for fabricating a semiconductor device according to further embodiments of the inventive subject matter will now be described with reference to FIGS. 3 through 6 and 9A through 12.

Figure 14:
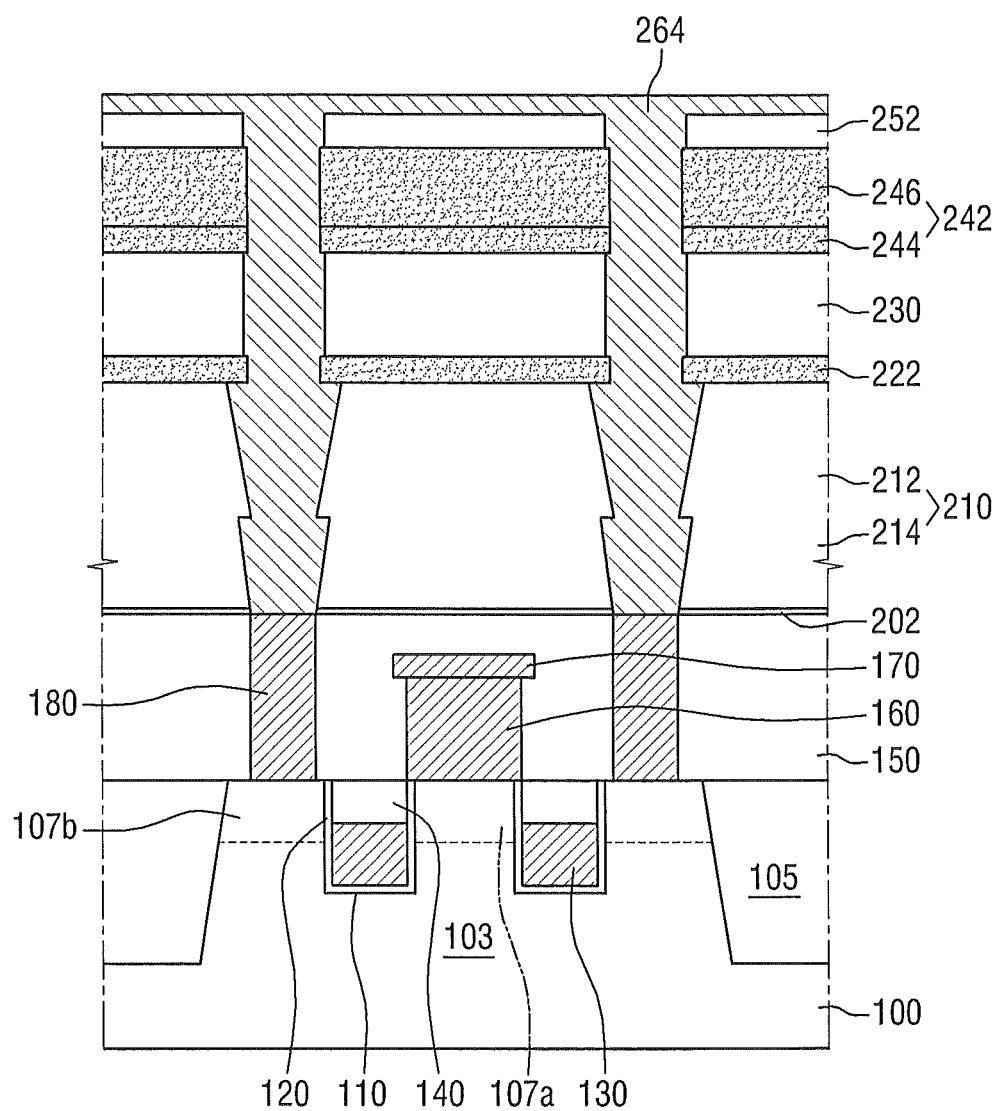
FIGS. 14 and 15 are views illustrating intermediate processes included in a method of fabricating a semiconductor device according to further embodiments of the inventive subject matter.
Figure 15:
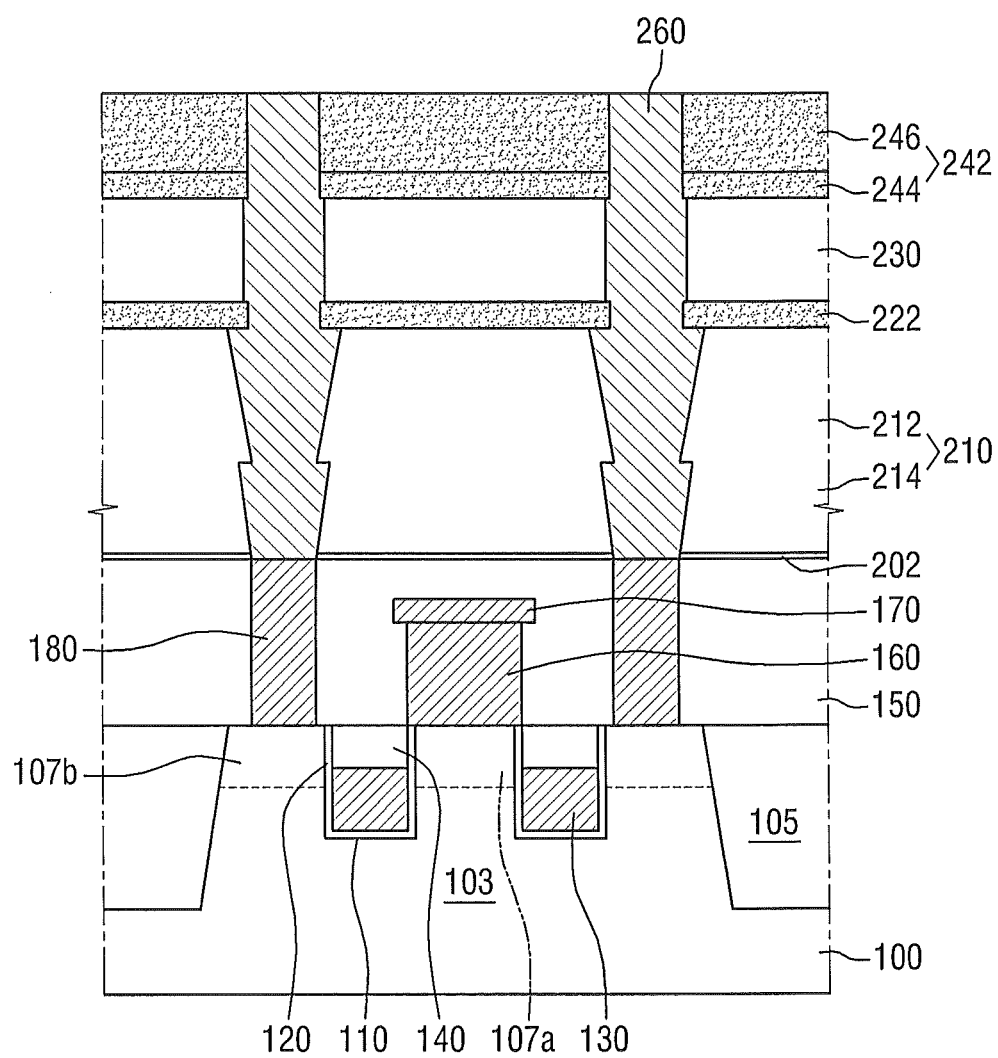

FIGS. 14 and 15 are views illustrating intermediate processes for fabricating a semiconductor device according to further embodiments of the inventive subject matter.

Referring to FIG. 14, a bottom electrode film 264 is formed to fill contact holes 250 and cover a node mask 252. The bottom electrode film 264 may be a conductive material and include at least one of doped polysilicon, conductive metal nitride, metal, and conductive metal silicide.

Referring to FIG. 15, a bottom electrode 260 is formed by removing part of the bottom electrode film 264 and the node mask 252 until a second support film 242 is exposed. By the removal of the node mask 252, each bottom electrode 260 may be electrically insulated from an adjacent bottom electrode 260. The process for removing the bottom electrode film 264 and the node mask 252 may include at least one of a CMP process and an etch-back process.

The bottom electrode 260 fills each of the contact holes 250 and is electrically connected to each of second contact plugs 180. The bottom electrode 260 may be pillar-shaped. The pillar-shaped bottom electrode 260 may have stepped sidewalls. The pillar-shaped bottom electrode 260 may be shaped like multiple inverted trapezoids coupled to each other.

A second trench 245 for forming a second support pattern 240 is formed by removing a second mold film 230 and a lower second support film 244 or removing the second mold film 230 using, for example, a wet-etching process.

Operations for fabricating a semiconductor device according to additional embodiments of the inventive subject matter will now be described with reference to FIGS. 2A, 4 through 8, 11A through 12, and 16A through 18.

FIGS. 16A through 18 are views illustrating intermediate processes for fabricating a semiconductor device according to further embodiments of the inventive subject matter.

Figure 16A:
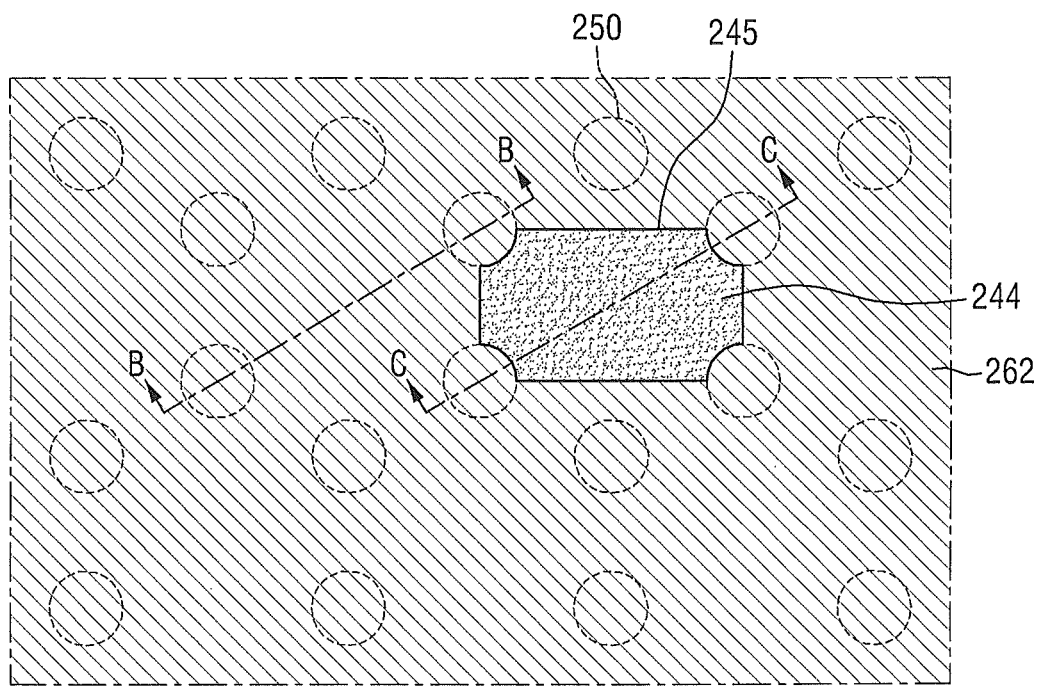
FIGS. 16A through 18 are views illustrating intermediate processes included in a method of fabricating a semiconductor device according to further embodiments of the inventive subject matter.
Figure 16B:
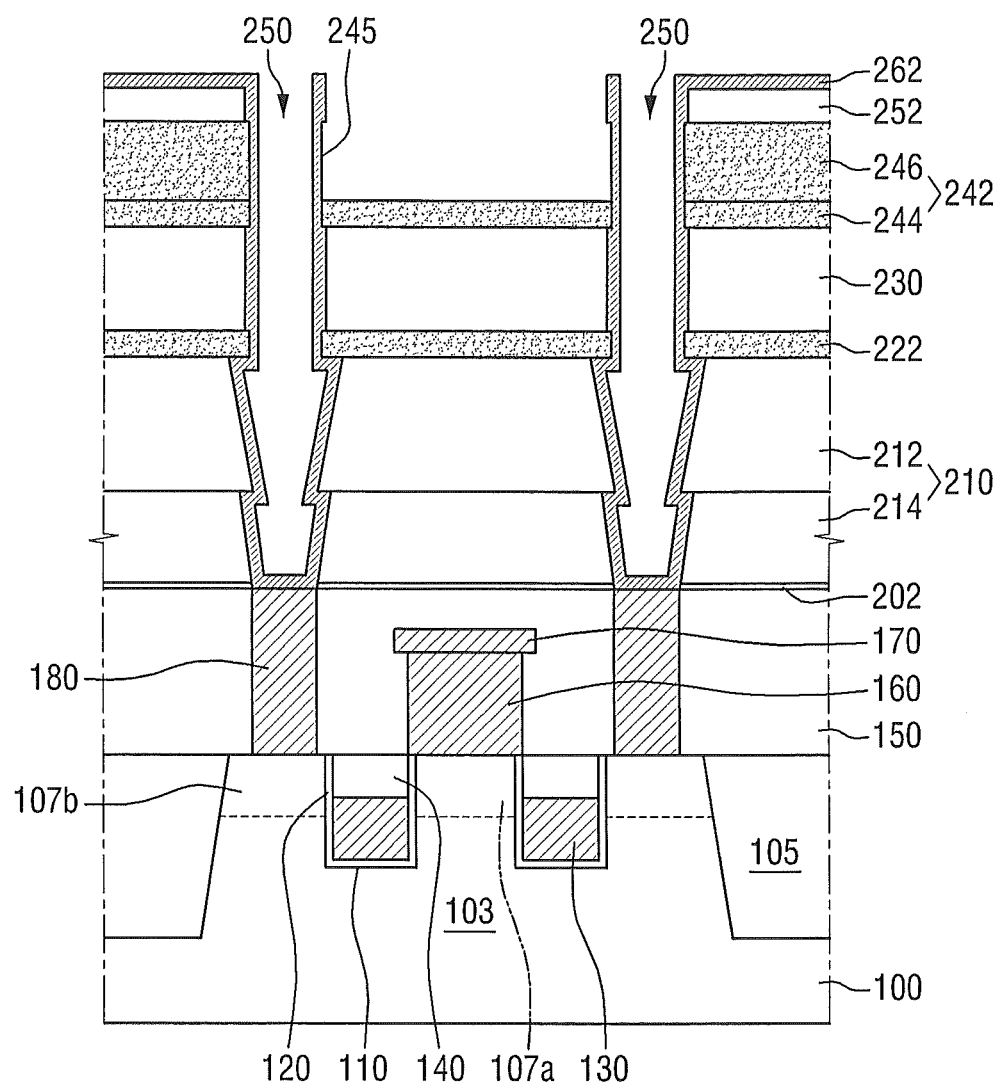

Referring to FIGS. 16A and 16B, a bottom electrode film 262 is formed on inner walls of contact holes 250 and a node mask 252. Then, a second trench 245 is formed in a second support film 242. The second trench 245 exposes a lower second support film 244. However, the inventive subject matter is not limited thereto. For example, the second trench 245 can expose a second mold film 230.

Specifically, a mask pattern (not shown) for forming the second trench 245 is formed on the bottom electrode film 262 on the substrate 100. Using the mask pattern as an etch mask, part of the bottom electrode film 262 and part of the node mask 252 are removed, thereby exposing the second support film 242. Then, an upper second support film 246 of the exposed second support film 242 is etched to form the second trench 245, which exposes the lower second support film 244, in the second support film 242. The etching process for forming the second trench 245 may be, for example, a dry-etching process. The bottom electrode film 262, the node mask 252, and the upper second support film 246 may be etched by separate etching processes. However, the inventive subject matter is not limited thereto.

A cross-section taken along the line B-B of FIG. 16A may be identical to the cross-section of FIG. 7.

Referring to FIG. 16B, sidewalls of the second trench 245 may consist of the bottom electrode film 262 and the upper second support film 246, and a bottom surface of the second trench 245 may be a top surface of the lower second support film 244. A portion of the upper second support film 246 which is located directly above a first contact plug 160 may be removed. The contact holes 250 having the bottom electrode film 262 formed on the inner walls thereof may be disposed around the second trench 245.

Figure 17:
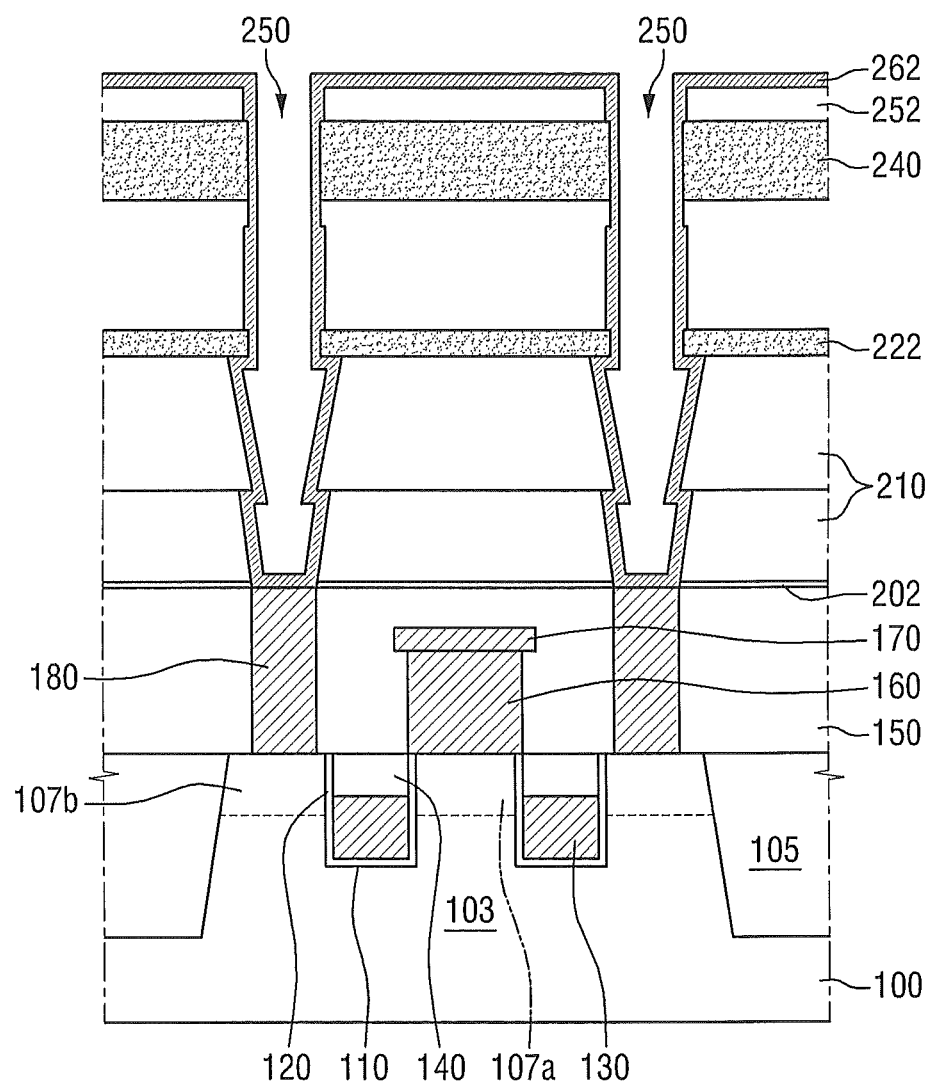

Referring to FIG. 17, a second support pattern 240 may be formed to surround the bottom electrode film 262 by removing the lower second support film 244 and the second mold film 230. The etching process for forming the second support pattern 240 may be, but is not limited to, a wet-etching process. A space formed by removing the lower second support film 244 and the second mold film 230 may be covered with the bottom electrode film 262.

Figure 18:
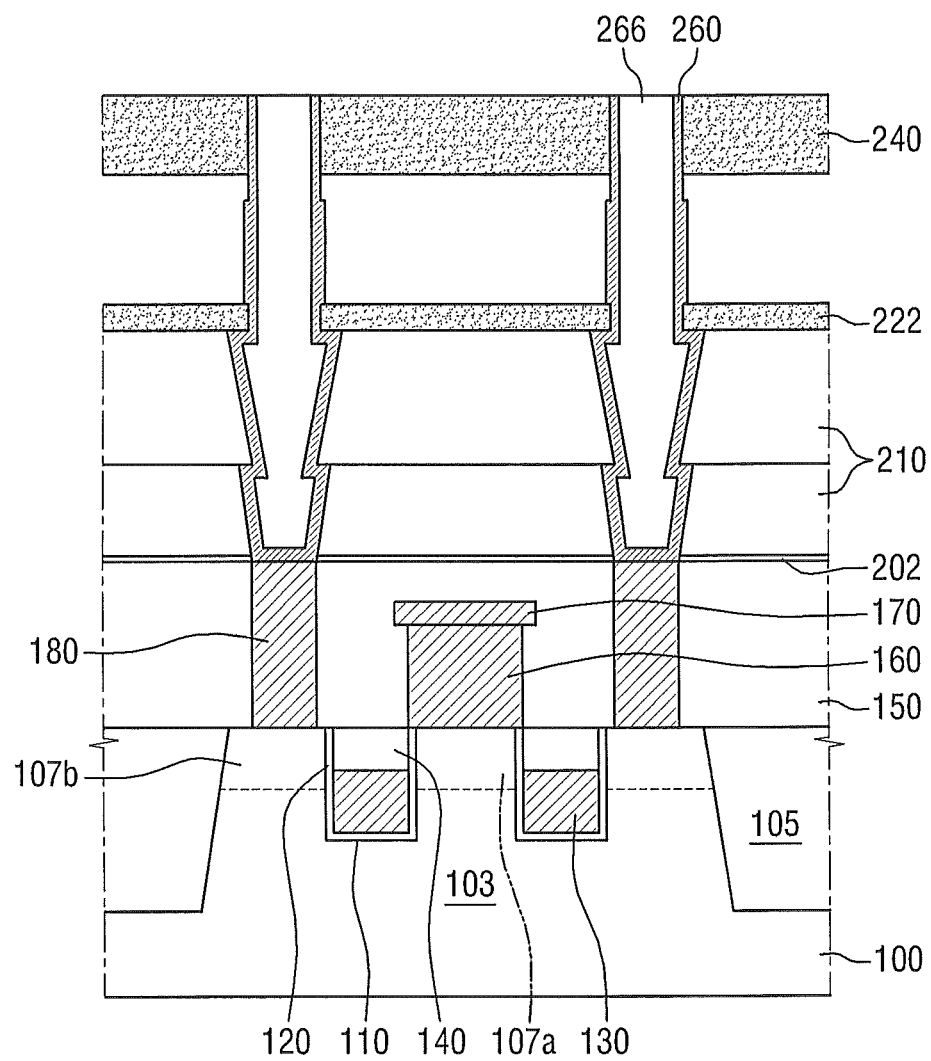

Referring to FIG. 18, a sacrificial film 266 is formed on the bottom electrode film 262 in the contact holes 250. The sacrificial film 266 may include a material having a good gap-filling capability and may include oxide.

Using a process which may include at least one of a CMP process and an etch-back process, the node mask 252 on the second support pattern 240, the bottom electrode film 262 and the sacrificial film 266 may be removed until the second support pattern 240 is exposed. As a result, the bottom electrode 260 may be formed in each of the contact holes 250 to be electrically connected to each of the second contact plugs 180. Each of the contact holes 250 in which the bottom electrode 260 is formed may be filled with the sacrificial film 266. An upper part of the cylindrical bottom electrode 260 having the sacrificial film 266 therein is surrounded by a space formed by the removal of the lower second support film 244 and the second mold film 230, and a lower part of the cylindrical bottom electrode 260 is surrounded by a first mold film 210 and a first support film 222.

A third trench may be formed in the first support film 222. After the third trench is formed, the first mold film 210 and the sacrificial film 266 in the bottom electrode 260 are removed. A first support pattern 220 may be formed to surround the bottom electrode 260.

The bottom electrode 260 may be cylindrical. However, the inventive subject matter is not limited thereto. For example, a pillar-shaped bottom electrode can be formed by filling each of the contact holes 250.

Figure 19:
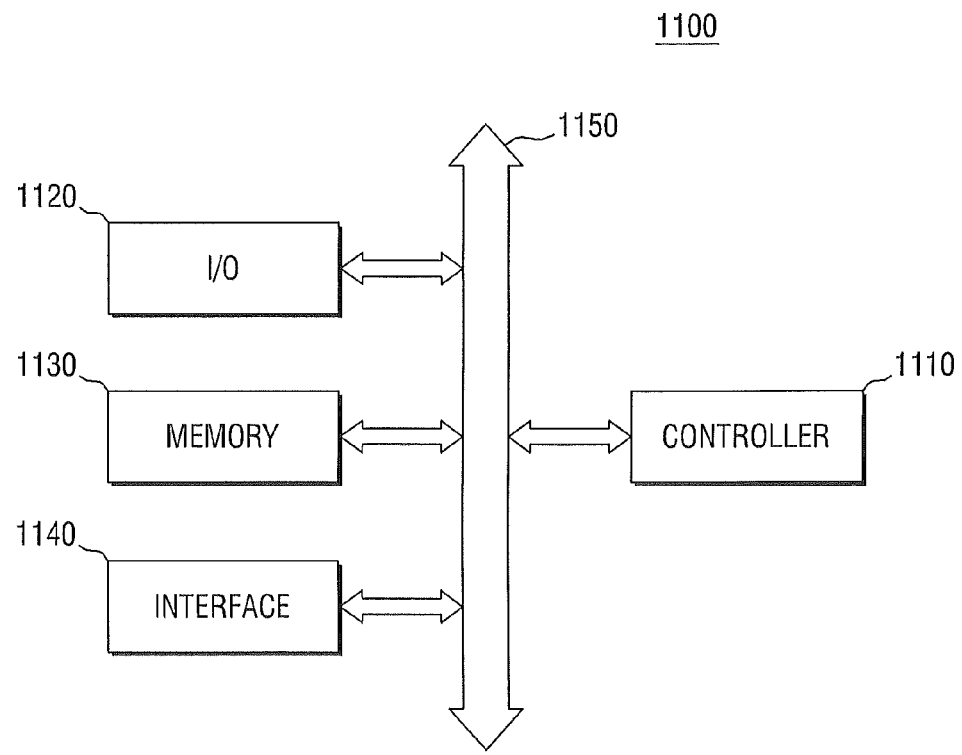
FIG. 19 is a block diagram of an example electronic system including a semiconductor device fabricated using a method of fabricating a semiconductor device according to some embodiments of the inventive subject matter.

FIG. 19 is a block diagram of an example electronic system 1100 including a semiconductor device fabricated using a method of fabricating a semiconductor device according to some embodiments of the inventive subject matter.

Referring to FIG. 19, the electronic system 1100 according to some embodiments of the inventive subject matter may include a controller 1110, an input/output (I/O) device 1120, a memory device 1130, an interface 1140, and a bus 1150. The controller 1110, the I/O device 1120, the memory device 1130, and/or the interface 1140 may be coupled to each other through the bus 1150. The bus 1150 corresponds to a path through which data transfer.

The controller 1110 may include at least one of a microprocessor, a digital signal processor, a microcontroller, and at least one of logic devices capable of performing similar functions to the above elements. The I/O device 1120 may include at least one of a keypad, a keyboard, and a display device. The memory device 1130 may store data and/or commands. The memory device 1130 may include any one of the semiconductor devices disclosed in the above embodiments. The memory device 1130 may include a DRAM. The interface 1140 may transmit data to a communication network or receive data from the communication network. The interface 1140 can be in a wired or wireless form. For example, the interface 1140 may be an antenna or a wired/wireless transceiver.

The electronic system 1100 can be applied to a personal digital assistant (PDA), a portable computer, a web tablet, a wireless phone, a mobile phone, a digital music player, a memory card, and all electronic products that can transmit and/or receive information in a wireless environment.

Figure 20:
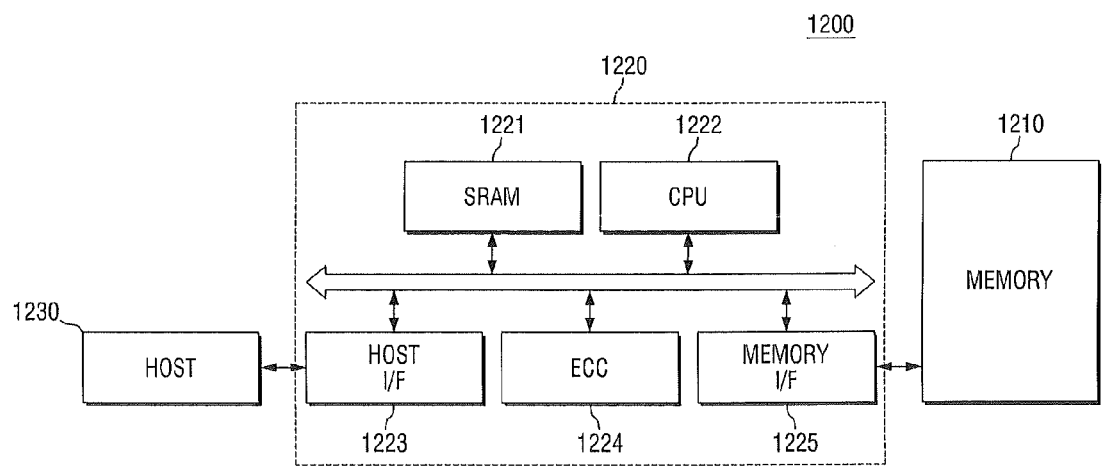
FIG. 20 is a block diagram of an example memory card including a semiconductor device fabricated using a method of fabricating a semiconductor device according to some embodiments of the inventive subject matter.

FIG. 20 is a block diagram of an example memory card 1200 including a semiconductor device fabricated using a method of fabricating a semiconductor device according to some embodiments of the inventive subject matter.

Referring to FIG. 20, a memory 1210 including a semiconductor device fabricated according to various embodiments of the inventive subject matter can be employed in the memory card 1200. The memory card 1200 may include a memory controller 1220 which controls data exchange between a host 1230 and the memory 1210. A static random access memory (SRAM) 1221 may be used as an operation memory of a central processing unit (CPU) 1222. A host interface 1223 may include protocols used by the host 1230 to access the memory card 1200 and exchange data with the memory card 1200. An error correction code (ECC) 1224 may detect and correct errors of data read from the memory 1210. A memory interface 1225 may interface with the memory 1210. The CPU 1222 may control the overall data exchange-related operation of the memory controller 1220.

In concluding the detailed description, those skilled in the art will appreciate that many variations and modifications can be made to the preferred embodiments without substantially departing from the principles of the inventive subject matter. Therefore, the disclosed preferred embodiments of the invention are used in a generic and descriptive sense only and not for purposes of limitation.

What is claimed is:

1. A method comprising:
    sequentially forming a first mold film comprising a lower first mold film and an upper first mold film on the lower first mold film, a first support film, a second mold film, and a second support film on a substrate,
        wherein the upper first mold film has a different etch rate than the lower first mold film;
    forming a contact hole through the second support film, the second mold film, the first support film and the first mold film;
    forming an electrode in the contact hole; and
    removing portions of the second support film, the second mold film and the first mold film to leave a portion of the first support film as a first support pattern surrounding the electrode and to leave a portion of the second support film as a second support pattern surrounding the electrode.

2. The method of claim 1, wherein the second support film comprises an upper second support film and a lower second support film, and wherein removing portions of the second support film, the second mold film and the first mold film to leave a portion of the first support film as a first support pattern surrounding the electrode and to leave a portion of the second support film as a second support pattern surrounding the electrode comprises removing a portion of the lower second support film.

3. The method of claim 2, wherein the upper second support film is in contact with the lower second support film.

4. The method of claim 2, wherein removing portions of the second support film, the second mold film and the first mold film to leave a portion of the first support film as a first support pattern surrounding the electrode and to leave a portion of the second support film as a second support pattern surrounding the electrode comprises:
    forming a trench exposing the lower second support film; and
    removing the portion of the lower second support film and the portion of the second mold film using the trench as an etchant passage.

5. The method of claim 4, wherein the trench comprises a first trench and wherein removing portions of the second support film, the second mold film and the first mold film to leave a portion of the first support film as a first support pattern surrounding the electrode and to leave a portion of the second support film as a second support pattern surrounding the electrode further comprises:
    forming a second trench exposing the first mold film; and
    removing the portion of the first mold film using the second trench as an etchant passage.

6. The method of claim 2, wherein a thickness of the lower second support film is about 0.1 to about 0.9 times a thickness of the second support film.

7. The method of claim 1, wherein the forming of the contact hole comprises:
    forming a node mask on the second support film; and
    etching the second support film, the second mold film, the first support film and the first mold film using the node mask as a mask.

8. The method of claim 7, wherein forming an electrode in the contact hole comprises:
    forming an electrode film conforming to an inner wall of the contact hole and a top surface of the node mask;
    forming a sacrificial film on the electrode film in the contact hole; and
    removing portions of the electrode film to expose the second support film.

9. The method of claim 1, further comprising:
    forming a dielectric film on the electrode and the first and second support patterns; and
    forming another electrode on the dielectric film.

10. A method comprising:
    sequentially forming a first mold film, a first support film, a second mold film, a lower second support film and an upper second support film on a substrate;
    forming a contact hole in the first mold film, the first support film, the second mold film, the lower second support film and the upper second support film;
    forming an electrode film in the contact hole;
    removing portions of the lower second support film and the second mold film to leave a portion of the upper second support film as a support pattern surrounding the electrode film; and
    forming an electrode in the contact hole by removing a portion of the electrode film to expose the support pattern.

11. The method of claim 10, wherein removing portions of the lower second support film and the second mold film to leave a portion of the upper second support film as a support pattern surrounding the electrode film comprises:
    forming a trench exposing the lower second support film; and
    removing the portions of the lower second support film and the second mold film after the forming of the first trench.

12. The method of claim 11:
    wherein forming an electrode film in the contact hole comprises forming the electrode film to conform to an inner wall of the contact hole;
    wherein forming an electrode in the contact hole by removing a portion of the electrode film to expose the support pattern is preceded by forming a sacrificial film on the electrode film in the contact hole; and
    wherein forming an electrode in the contact hole by removing a portion of the electrode film to expose the support pattern comprises:
        removing portions of the sacrificial film and the electrode film to expose the support pattern; and
    removing the sacrificial film.

13. A method comprising:
    sequentially forming a mold film and a support film on a conductive region in a substrate;
    removing portions of the support film and the mold film to form a contact hole passing through the support film and the mold film and exposing the conductive region;
    forming an electrode in the contact hole and in electrical contact with the conductive region;
    forming a trench through the support film and exposing portions of the support film and the mold film; and
    etching the exposed portions of the support film to remove at least a portion of the mold film and leave a portion of the support film as a support pattern surrounding the electrode.

14. The method of claim 13, wherein etching the exposed portions of the support film to remove at least a portion of the mold film and leave a portion of the support film as a support pattern surrounding the electrode comprises removing a lower portion of the support film while leaving an upper portion of the support film as the support pattern.

15. The method of claim 13, wherein the electrode comprises an electrode film conforming to an inner wall of the contact hole, and further comprising forming a dielectric layer on the electrode film and another electrode on the dielectric layer.

16. The method of claim 13, wherein the contact hole has a stepped inner wall.

17. The method of claim 16, wherein the contact hole has a step proximate an interface of the mold layer and the support layer.

18. The method of claim 13:
wherein sequentially forming a mold film and a support film on a conductive region in a substrate comprises sequentially forming a first mold film, a first support film, a second mold film and a second support film on the conductive region;
wherein removing portions of the support film and the mold film to form a contact hole passing through the support film and the mold film and exposing the conductive region comprises removing portions of the second support film, the second mold film, the first support film and the first mold film to form the contact hole;
wherein forming a trench through the support film and exposing portions of the support film and the mold film comprises forming a first trench through the second support film exposing portions of the second support film and the second mold film;
wherein etching the exposed portions of the support film to remove at least a portion of the mold film and leave a portion of the support film as a support pattern surrounding the electrode comprises etching the exposed portions of the second support film and the second mold film to leave a portion of the second support film as a first support pattern surrounding the electrode;
wherein forming a trench through the support film and exposing portions of the support film and the mold film further comprises forming a second trench through the first support film exposing portions of the first support film and the first mold film; and
wherein etching the exposed portions of the support film to remove at least a portion of the mold film and leave a portion of the support film as a support pattern surrounding the electrode comprises etching the exposed portion of the first mold film to leave a portion of the first support film as a second support pattern surrounding the electrode.

* * * * *